United States Patent
Hwang et al.

(10) Patent No.: US 12,080,585 B2
(45) Date of Patent: Sep. 3, 2024

(54) WET ALIGNMENT METHOD FOR MICRO-SEMICONDUCTOR CHIP AND DISPLAY TRANSFER STRUCTURE

(71) Applicant: SAMSUNG ELECTRONICS CO., LTD., Suwon-si (KR)

(72) Inventors: Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/312,641

(22) Filed: May 5, 2023

(65) Prior Publication Data

US 2023/0274969 A1   Aug. 31, 2023

Related U.S. Application Data

(63) Continuation of application No. 17/324,609, filed on May 19, 2021.

(30) Foreign Application Priority Data

Jul. 10, 2020 (KR) .................. 10-2020-0085248
Jan. 27, 2021 (KR) .................. 10-2021-0011792

(51) Int. Cl.
*H01L 21/683* (2006.01)
*H01L 25/075* (2006.01)
(Continued)

(52) U.S. Cl.
CPC ...... *H01L 21/6835* (2013.01); *H01L 25/0753* (2013.01); *H01L 33/50* (2013.01);
(Continued)

(58) Field of Classification Search
CPC . H01L 21/6835; H01L 22/20; H01L 25/0753; H01L 33/0095; H01L 33/62;
(Continued)

(56) References Cited

U.S. PATENT DOCUMENTS 5,545,291 A * 8/1996 Smith ............... H01L 23/13
257/E21.705
5,824,186 A * 10/1998 Smith ............... H01L 25/04
257/E21.705

(Continued)

FOREIGN PATENT DOCUMENTS

EP   3 352 211 A1   7/2018
JP   2010-45145 A   2/2010
(Continued)

OTHER PUBLICATIONS

Communication issued Dec. 13, 2021 by the European Patent Office in counterpart European Patent Application No. 21184073.1.
(Continued)

*Primary Examiner* — Vu A Vu
(74) *Attorney, Agent, or Firm* — Sughrue Mion, PLLC

(57) ABSTRACT

A wet alignment method for a micro-semiconductor chip and a display transfer structure are provided. The wet alignment method for a micro-semiconductor chip includes: supplying a liquid to a transfer substrate including a plurality of grooves; supplying the micro-semiconductor chip onto the transfer substrate; scanning the transfer substrate by using an absorber capable of absorbing the liquid. According to the wet alignment method, the micro-semiconductor chip may be transferred onto a large area.

24 Claims, 28 Drawing Sheets

(51) Int. Cl.
    *H01L 33/50*     (2010.01)
    *H01L 33/52*     (2010.01)
    *H01L 33/62*     (2010.01)

(52) U.S. Cl.
    CPC .............. *H01L 33/52* (2013.01); *H01L 33/62* (2013.01); *H01L 2221/68309* (2013.01); *H01L 2221/68313* (2013.01); *H01L 2221/68354* (2013.01); *H01L 2221/68368* (2013.01); *H01L 2933/0041* (2013.01); *H01L 2933/005* (2013.01); *H01L 2933/0066* (2013.01)

(58) Field of Classification Search
    CPC . H01L 2221/68354; H01L 2221/68368; H01L 2933/0066; H01L 33/20; H01L 2221/68313; H01L 2221/68322; H01L 22/22; H01L 21/67
    USPC .......................................................... 257/89
    See application file for complete search history.

(56) References Cited

U.S. PATENT DOCUMENTS

| | | | |
|---|---|---|---|
| 6,780,696 B1 | 8/2004 | Schatz | |
| 6,790,692 B2* | 9/2004 | Onozawa | H01L 25/50 257/E21.705 |
| 6,825,049 B2* | 11/2004 | Fonstad, Jr. | H01L 21/2007 438/694 |
| 7,198,978 B2 | 4/2007 | Onozawa | |
| 7,321,159 B2* | 1/2008 | Schatz | H01L 25/50 257/E21.705 |
| 7,861,405 B2* | 1/2011 | Chow | H01L 24/95 438/106 |
| 7,943,052 B2* | 5/2011 | Wu | B23K 3/0623 216/37 |
| 7,977,130 B2 | 7/2011 | Hillis et al. | |
| 8,558,243 B2 | 10/2013 | Bibl et al. | |
| 8,609,454 B2 | 12/2013 | Dai et al. | |
| 8,860,365 B2 | 10/2014 | Hillis et al. | |
| 9,252,328 B2 | 2/2016 | Crowder et al. | |
| 9,281,451 B2 | 3/2016 | Yeh et al. | |
| 9,484,492 B2 | 11/2016 | Bour et al. | |
| 9,537,063 B2 | 1/2017 | Herrmann et al. | |
| 9,825,016 B1 | 11/2017 | Kim et al. | |
| 9,825,202 B2 | 11/2017 | Schuele et al. | |
| 9,862,141 B2 | 1/2018 | Marinov et al. | |
| 9,865,577 B2 | 1/2018 | Bibl et al. | |
| 9,935,241 B2 | 4/2018 | Do et al. | |
| 10,050,080 B2 | 8/2018 | Gilet et al. | |
| 10,242,977 B2 | 3/2019 | Sasaki et al. | |
| 10,293,600 B2 | 5/2019 | Kanke | |
| 10,297,722 B2 | 5/2019 | Chang et al. | |
| 10,319,878 B2 | 6/2019 | Ulmer et al. | |
| 10,347,513 B2 | 7/2019 | Schuele et al. | |
| 10,381,507 B2 | 8/2019 | Mezouari et al. | |
| 10,418,527 B2* | 9/2019 | Sasaki | H01L 33/62 |
| 10,431,718 B2 | 10/2019 | Crowder et al. | |
| 10,446,728 B2 | 10/2019 | Sasaki et al. | |
| 10,516,084 B2* | 12/2019 | Sasaki | H01L 25/0753 |
| 10,543,486 B2 | 1/2020 | Sasaki et al. | |
| 10,862,010 B2 | 12/2020 | Bonar et al. | |
| 10,879,182 B2 | 12/2020 | Garner et al. | |
| 11,205,738 B2 | 12/2021 | Chen et al. | |
| 2006/0210769 A1* | 9/2006 | Swindlehurst | H01L 25/50 257/E21.705 |
| 2007/0079571 A1 | 4/2007 | Schatz | |
| 2010/0128069 A1 | 5/2010 | Hillis et al. | |
| 2016/0336484 A1 | 11/2016 | McGroddy et al. | |
| 2017/0125392 A1 | 5/2017 | Bibl et al. | |
| 2017/0133558 A1 | 5/2017 | Sasaki et al. | |
| 2017/0271556 A1 | 9/2017 | Yoon et al. | |
| 2018/0090058 A1 | 3/2018 | Chen et al. | |
| 2018/0102352 A1 | 4/2018 | Sasaki et al. | |
| 2018/0294254 A1 | 10/2018 | Chen et al. | |
| 2018/0374738 A1 | 12/2018 | Lee et al. | |
| 2019/0157517 A1 | 5/2019 | Koposov | |
| 2019/0172968 A1 | 6/2019 | Yuen | |
| 2019/0181304 A1 | 6/2019 | Sasaki et al. | |
| 2021/0091257 A1 | 3/2021 | Hwang et al. | |
| 2021/0119079 A1 | 4/2021 | Hwang et al. | |
| 2021/0159361 A1 | 5/2021 | Hwang et al. | |
| 2021/0249556 A1 | 8/2021 | Hwang et al. | |

FOREIGN PATENT DOCUMENTS

| | | |
|---|---|---|
| KR | 10-2017-0084139 A | 7/2017 |
| KR | 10-1961834 B1 | 3/2019 |
| KR | 10-2019-0070588 A | 6/2019 |
| WO | 2016/146658 A1 | 9/2016 |

OTHER PUBLICATIONS

Zhou, Xiaojie et al., "Growth, transfer printing and colour conversion techniques towards full-colour micro-LED display," Progress in Quantum Electronics, Apr. 21, 2020, vol. 71, XP086184281. (31 pages total).

* cited by examiner

WET ALIGNMENT METHOD FOR MICRO-SEMICONDUCTOR CHIP AND DISPLAY TRANSFER STRUCTURE

CROSS-REFERENCE TO RELATED APPLICATIONS

This application is a continuation of U.S. application Ser. No. 17/324,609, filed May 19, 2021, claims priority from Korean Patent Application Nos. 10-2020-0085248 and 10-2021-0011792, filed on Jul. 10, 2020, and Jan. 27, 2021, respectively, in the Korean Intellectual Property Office, the disclosures of which are incorporated by reference herein in their entireties.

BACKGROUND

1. Field

Apparatuses and methods consistent with example embodiments relate to a wet alignment method for a micro-semiconductor chip and a display transfer structure.

2. Description of the Related Art

Light-emitting diodes (LEDs) are widely used for various illumination devices and liquid crystal display (LCD) backlight units as well as for display apparatuses, and the industrial demand for LEDs has increased since LEDs provide benefits associated with low power consumption and environment-friendly characteristics. When manufacturing a display apparatus using a micro-LED chip, a pick and place method is used as a method of transferring the micro-LED chip. However, according to this method, a transfer yield rate decreases as the size of the micro-LED decreases and the size of the display apparatus increases.

SUMMARY

Example embodiments address at least the above problems and/or disadvantages and other disadvantages not described above. Also, the example embodiments are not required to overcome the disadvantages described above, and may not overcome any of the problems described above.

One or more example embodiments provide a wet alignment method for a micro-semiconductor chip.

Further, one or more example embodiments provide a display transfer structure in which a micro-semiconductor chip is aligned.

Additional aspects will be set forth in part in the description which follows and, in part, will be apparent from the description, or may be learned by practice of example presented embodiments of the disclosure.

According to an aspect of an embodiment, there is provided a wet alignment method for a micro-semiconductor chip, the wet alignment method comprising: supplying a liquid to a plurality of grooves in a transfer substrate; supplying a plurality of micro-semiconductor chips onto the transfer substrate; and aligning the plurality of micro-semiconductor chips with the plurality of grooves by scanning the transfer substrate by using a liquid absorber.

The supplying of the liquid may include at least one of spraying, dispensing, inkjet dot spreading, and spilling the liquid onto the transfer substrate.

The supplying of the liquid may be simultaneously performed with the supplying of the plurality of micro-semiconductor chips.

The supplying of the liquid and the supplying of the plurality of micro-semiconductor chips may be performed as a single process of supplying a suspension that includes the liquid and the micro-semiconductor chip to the transfer substrate.

The supplying of the suspension to the transfer substrate may include at least one of spraying, dispensing, inkjet dot spreading, and spilling the suspension to the transfer substrate.

The supplying of the liquid, the supplying of the plurality of micro-semiconductor chips, and the aligning may include: soaking the liquid absorber in a suspension comprising the liquid and the plurality of micro-semiconductor chips; and scanning the transfer substrate by using the liquid absorber.

The supplying of the plurality of micro-semiconductor chips may include: attaching the plurality of micro-semiconductor chips to the liquid absorber; and disposing the liquid absorber to which the plurality of semiconductor chips are attached, to contact the transfer substrate.

The supplying of the plurality of micro-semiconductor chips may include: preparing a suspension by including the plurality of micro-semiconductor chips in another liquid; and providing the suspension to the transfer substrate.

At least one of the supplying of the liquid, the supplying of the plurality of micro-semiconductor chips, and the aligning the plurality of micro-semiconductor chips may be repeated a plurality of times.

The aligning the plurality of micro-semiconductor chips may include allowing the liquid absorber to contact the transfer substrate and pass across the plurality of grooves.

The aligning the plurality of micro-semiconductor chips may include at least one of a reciprocating motion, a translation motion, a rotational motion, a rolling motion, a rubbing motion, and a spinning motion of the liquid absorber, or may include at least one of a reciprocating motion, a translation motion, a rotational motion, a rolling motion, a rubbing motion, and a spinning motion of the transfer substrate.

The liquid may include any one or any combination of water, ethanol, alcohol, polyol, ketone, halocarbon, acetone, a flux, and an organic solvent.

The liquid absorber may include fabric, a tissue, a polyester fiber, paper, or a wiper.

A first micro-semiconductor chip of the plurality of micro-semiconductor chips may include an electrode disposed on a surface of the first micro-semiconductor chip. When the first micro-semiconductor chip enters a first groove of the plurality of grooves, the electrode of the first micro-semiconductor chip may be disposed to face an upper opening of the first groove via the scanning of the transfer substrate by using the liquid absorber.

The electrode may include at least one of Al, Au, Pt, Mo, Cu, Ag, and Zn.

The transfer substrate may include a metal layer disposed on an upper surface of the plurality of grooves.

The metal layer comprises at least one of Ag, Au, Pt, Ni, Cr, and Al.

According to an aspect of an embodiment, there is provided a display transfer structure including: a transfer substrate including a plurality of grooves; and a plurality of micro-semiconductor chips that are disposed in the plurality of grooves, wherein each of the plurality of micro-semiconductor chips may include an electrode that is disposed to face an upper opening of a corresponding grove of the plurality of grooves.

The transfer substrate may include a metal layer disposed on an upper surface of the plurality of grooves.

The metal layer may include at least one of Ag, Au, Pt, Ni, Cr, and Al.

The plurality of micro-semiconductor chips may be irregularly aligned with the plurality of grooves.

At least one of the plurality of micro-semiconductor chips may include a horizontal electrode structure.

The transfer substrate may include a transfer mold including the plurality of grooves.

The transfer substrate may include a region that corresponds to a sub-pixel, and may also include the plurality of grooves.

Each of the plurality of grooves has a size to accommodate two or more of the plurality of micro-semiconductor chips.

The display transfer structure may further include a color conversion layer disposed on the plurality of micro-semiconductor chips and configured to convert a color of light emitted from the plurality of micro-semiconductor chips.

According to an aspect of an embodiment, there is provided an apparatus for transferring a plurality of micro-semiconductor chips to a transfer substrate, the apparatus including: a memory storing one or more instructions; and at least one processor configured to execute the one or more instructions to: control a liquid supply to supply a liquid to a plurality of grooves in the transfer substrate; control a chip supply to supply the plurality of micro-semiconductor chips onto the transfer substrate; and control a liquid absorber to have the liquid absorber move across the transfer substrate while maintaining contact with the transfer substrate, pick up at least one micro-semiconductor chip, among the plurality of micro-semiconductor chips disposed on the transfer substrate, and release the at least one micro-semiconductor chip on at least one of the plurality of grooves.

A non-transitory computer-readable recording medium having recorded thereon a program which, when executed by at least one processor of a computer, causes the at least one processor to control a wet alignment device to perform the wet alignment method.

BRIEF DESCRIPTION OF THE DRAWINGS

The above and/or other aspects will be more apparent by describing certain example embodiments with reference to the accompanying drawings, in which.

DETAILED DESCRIPTION

Figure 1:
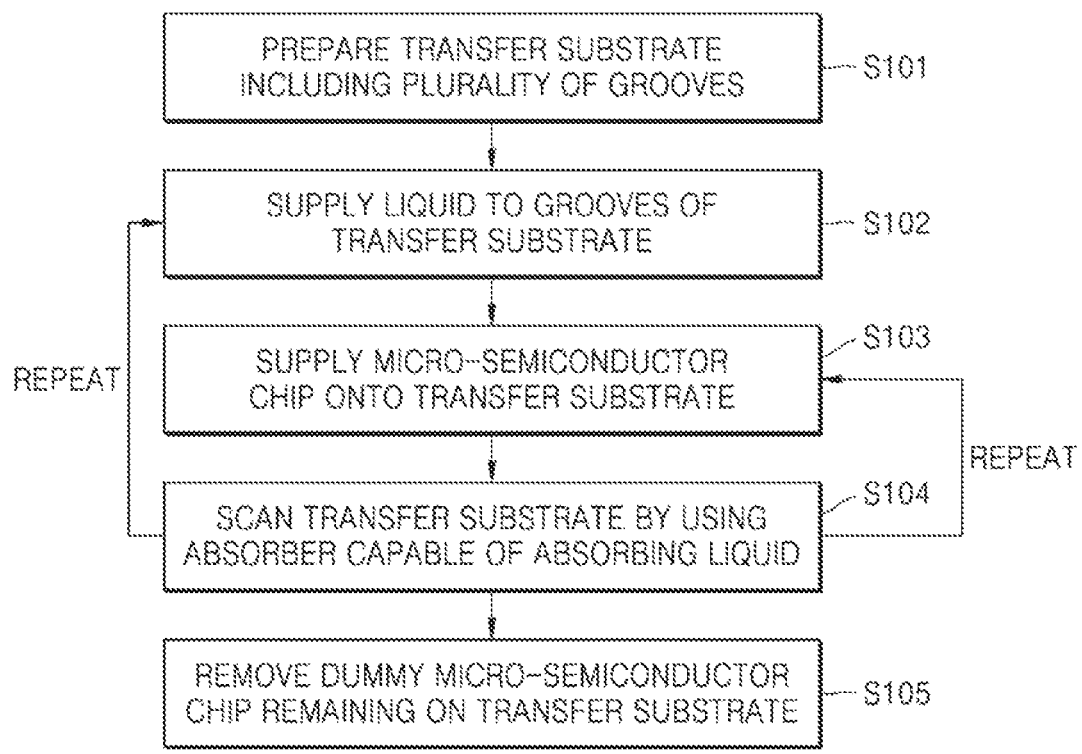
FIG. 1 is a flowchart of a wet alignment method for a micro-semiconductor chip, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a wet alignment method for a micro-semiconductor chip and a display transfer structure, according to various embodiments, will be described in detail with reference to the accompanying drawings. In the drawings, the same reference numerals denote the same elements and sizes of elements may be exaggerated for clarity and convenience of explanation. The terms "first," "second," etc. are used only for the purpose of distinguishing one component from another component and should not be otherwise interpreted in a limited sense.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements. A size of each element in the drawings may be exaggerated for clarity and convenience of explanation. Also, when a certain material layer is described as being on a substrate or another layer, the material layer may be on the substrate or the other layer by directly contacting the same, or a third layer may be arranged between the material layer, and the substrate or the other layer. Also, materials described to be included in each layer are examples, and materials other than the materials may also be used.

Also, the terms such as " . . . unit," "module," or the like used in the specification indicate a unit, which processes a function or a motion, and the unit may be implemented by hardware or software, or by a combination of hardware and software.

Particular executions described in embodiments are examples and do not limit the technical scope by any means. For the sake of brevity, conventional electronics, control systems, software development and other functional aspects may not be described. Furthermore, the connections or connectors shown in the various figures presented are intended to represent exemplary functional relationships and/or physical or logical couplings between the various elements. It should be noted that many alternative or additional functional relationships, physical connections or logical connections may be present in a practical device.

The term "the" and other equivalent determiners may correspond to a singular referent or a plural referent.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are not defined in the scope of the claims.

Figure 2:
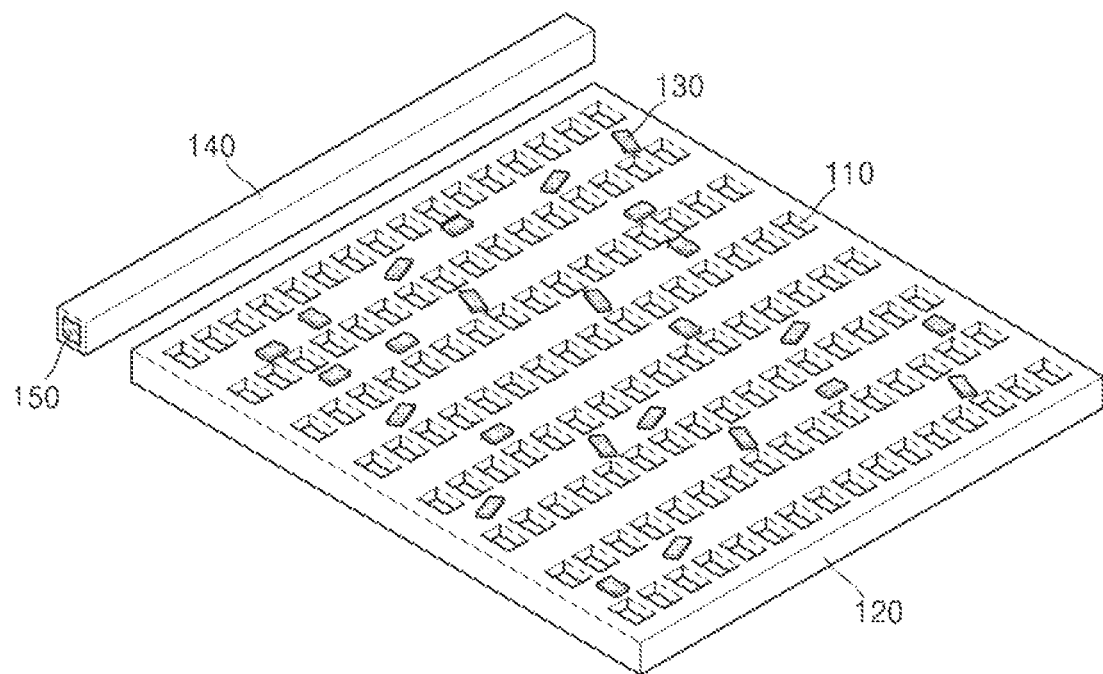
FIG. 2 illustrates a transfer substrate and an absorber that are used for a wet alignment method for a micro-semiconductor chip, according to an example embodiment.

FIG. 1 illustrates a wet alignment method for a micro-semiconductor chip, according to an example embodiment. FIG. 2 illustrates a wet alignment device for a micro-semiconductor chip, according to an example embodiment.

The wet alignment method for a micro-semiconductor chip, according to an example embodiment, is described with reference to FIGS. 1 and 2.

A transfer substrate 120 including a plurality of grooves 110 may be prepared (operation S101). The transfer substrate 120 may include a single layer or multiple layers. The plurality of grooves 110 may be provided to arrange a plurality of micro-semiconductor chips 130. The micro-semiconductor chip 130 may include various types of semiconductor chips having micro-sizes. The micro-sizes thereof may be equal to or less than 1000 μm or equal to or less than 200 μm. The micro-semiconductor chip 130 may include, for example, a light-emitting diode (LED), a complementary metal-oxide semiconductor (CMOS), a CMOS image sensor (CIS), a vertical-cavity surface-emitting laser (VCSEL), a photodiode (PD), a memory device, a 2-dimensional (2D) material device, etc. A 2D material may include graphene, carbon nanotubes (CNTs), etc.

A liquid may be supplied to the grooves 110 (operation S102). The liquid may include any types of liquids that do not corrode or damage the micro-semiconductor chips 130. The liquid may include, for example, any one or any combination of water, ethanol, alcohol, polyol, ketone, halocarbon, acetone, a flux, and an organic solvent. The organic solvent may include, for example, isopropyl alcohol (IPA). The available liquid is not limited thereto and may be variously modified.

Methods of supplying the liquid to the plurality of grooves 110 may include various methods. For example, spraying, dispensing, inkjet dot spreading, a method of spilling the liquid onto the transfer substrate 120, etc. may be used. This aspect will be described below. A supply amount of the liquid may be variously adjusted. For example, the liquid may be rightly provided in the plurality of grooves 110 or to spill over the grooves 110.

The plurality of micro-semiconductor chips 130 may be supplied onto the transfer substrate 120 (operation S103). The plurality of micro-semiconductor chips 130 may be directly sprinkled over the transfer substrate 120 without other liquids or may be supplied onto the transfer substrate 120 by being included in a suspension. Methods of supplying the micro-semiconductor chips 130 included in the suspension may include various methods. For example, spraying, dispensing that drips a liquid, inkjet dot spreading that discharges a liquid like a printing method, a method of spilling the suspension onto the transfer substrate 120, etc. may be used.

The transfer substrate 120 may be scanned by using an absorber 140 capable of absorbing a liquid (operation S104). The absorber 140 may include any types of materials capable of absorbing a liquid, and a shape or a structure of the absorber 140 is not particularly limited. The absorber 140 may include, for example, fabric, a tissue, a polyester fiber, paper, a wiper, or the like. The absorber 140 may be solely used without other auxiliary instruments. However, it is not limited thereto, and the absorber 140 may be coupled to a supporting plate 150 so as to conveniently scan the transfer substrate 120. The supporting plate 150 may have various shapes and structures that are appropriate for scanning the transfer substrate 120. The supporting plate 150 may include, for example, a rod, a blade, a plate, a wiper, or the like. The absorber 140 may be provided on a surface of the supporting plate 150 or may surround a circumference of the supporting plate 150.

The absorber 140 may scan the transfer substrate 120 by pressing the transfer substrate 120 by applying an appropriate pressure to the transfer substrate 120. The absorber 140 may scan the transfer substrate 120 across the plurality of grooves 110 while maintaining contact with the transfer substrate 120, thereby absorbing the liquid. The scanning may be performed based on various methods including, for example, sliding, rotating, translating, reciprocating, rolling, spinning, and/or rubbing of the absorber 140. Here, the methods may include both regular movements and irregular movements. The scanning may be performed by moving the transfer substrate 120, rather than the absorber 140. The scanning of the transfer substrate 120 may also be performed based on sliding, rotation, translation reciprocation, rolling, spinning, rubbing, or the like. However, the scanning may also be performed based on a collaboration of the absorber 140 and the transfer substrate 120.

In an example embodiment, operation S102 of supplying the liquid to the grooves 110 of the transfer substrate may be performed after operation S103 of supplying the micro-semiconductor chips 130 onto the transfer substrate 120. Alternatively, operations S102 and S103 may be simultaneously performed as a single operation, or may be performed in parallel as two separate operations. For example, by supplying a suspension including the micro-semiconductor chips 130, onto the transfer substrate 120, the liquid and the micro-semiconductor chips 130 may be simultaneously supplied onto the transfer substrate 120.

After the absorber 140 scans the transfer substrate 120, a micro-semiconductor chip which did not enter the grooves 110 and remain on the transfer substrate 120, that is, a dummy micro-semiconductor chip, may be removed (operation S105). Operations S102 through S104 may be repeated until the grooves 110 are filled with the micro-semiconductor chips 130 (e.g., all the grooves 110 are filled with the micro-semiconductor chips 130, or all the micro-semiconductor chips 130 are mounted in the grooves 110). Based on these operations, the micro-semiconductor chips 130 may be rapidly transferred onto the transfer substrate 120.

Figure 3:
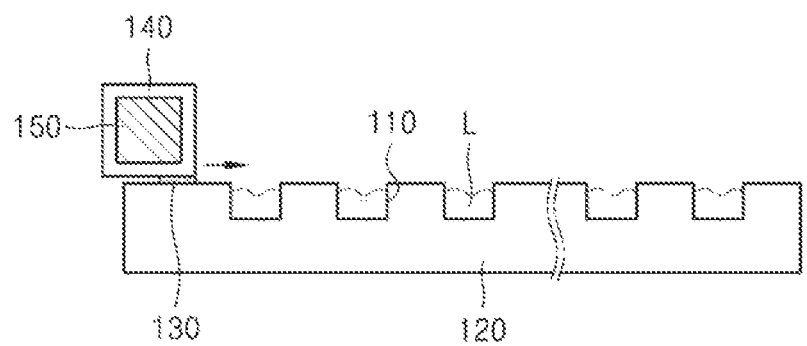
FIG. 3 illustrates a scanning process of a wet alignment method for a micro-semiconductor chip, according to an example embodiment.

Next, a process in which the micro-semiconductor chips 130 are transferred will be described in more detail. Referring to FIG. 3, the absorber 140 may be provided on a surface of the supporting plate 150, and in this state, may contact and scan a surface of the transfer substrate 120. While the scanning is performed, the micro-semiconductor chips 130 may be adsorbed or bonded to a surface of the absorber 140 and may be moved.

Figure 4:
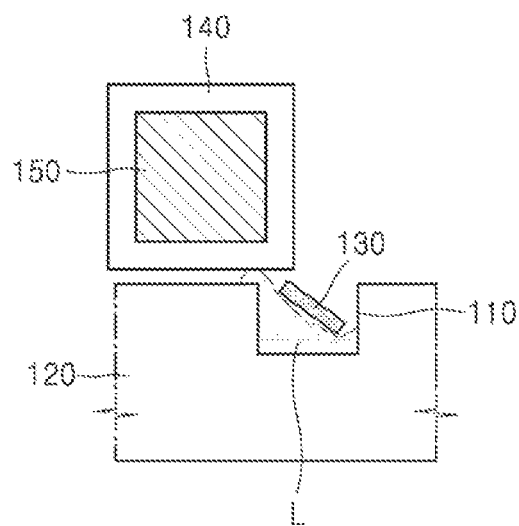
FIG. 4 illustrates a process in which a micro-semiconductor chip is aligned according to a wet alignment method for a micro-semiconductor chip, according to an example embodiment.

FIG. 4 is an enlarged view of one of the plurality of grooves 110. While the scanning is performed, the micro-semiconductor chip 130 may be disposed between the absorber 140 and the transfer substrate 120, and during a process in which the absorber 140 absorbs a liquid L in the grooves 110, the micro-semiconductor chip 130 may fall into the grooves 110.

Figure 5:
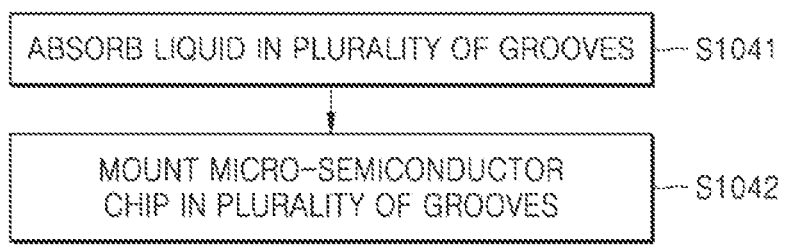
FIG. 5 is a flowchart of a wet alignment method for a micro-semiconductor chip, according to an example embodiment.

FIG. 5 is a flowchart of a method of transferring the micro-semiconductor chips 130 onto the grooves 110. Referring to FIG. 5, the scanning of the transfer substrate 120 via the absorber 140 may include absorbing the liquid L in the grooves 110 (operation S1041) and mounting the micro-semiconductor chips 130 into the grooves 110 (operation S1042). During a process in which the liquid L is absorbed by the absorber 140, at least a portion of the liquid L in the grooves 110 and the micro-semiconductor chips 130 may be substituted.

Referring to FIG. 1, until all of the micro-semiconductor chips 130 are transferred onto the grooves 110 of the transfer substrate 120, operation(s) S102, S103, and/or S104 may be repeatedly performed. For example, after the transfer substrate 120 is scanned by the absorber 140, when there is no liquid or a liquid is insufficient in the grooves 110 operation S102 of supplying the liquid to the grooves 110 may further be performed. When the transfer substrate 120 does not lack the micro-semiconductor chips 130, operation S103 may be skipped, and the method may proceed from operation S102 to operation S104. When an excessive amount of liquid is supplied to the transfer substrate 120, a portion of the liquid may be removed by using a blade. After the transfer substrate 120 is scanned via the absorber 140, when the transfer substrate 120 lacks the micro-semiconductor chips 130, operation S103 of supplying the micro-semiconductor chips 130 onto the transfer substrate 120 may further be performed. Based on this process, the micro-semiconductor chips 130 may be aligned on the transfer substrate 120.

Figure 6:
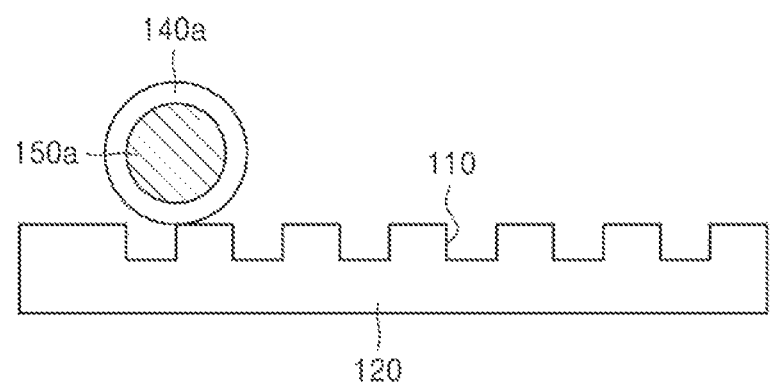
FIG. 6 illustrates a transfer substrate and an absorber that are used for a wet alignment method for a micro-semiconductor chip, according to an example embodiment.

FIG. 6 illustrates an example in which a supporting member 150a has a circular cross-section. Like the supporting member 150 of rod shape having a square cross-section of FIG. 2, an absorber 140a may be provided on the entire surface or a portion of the entire surface of the supporting plate 150a. The supporting plate may have various other shapes, in addition to the shapes described above.

Next, examples of the transfer substrate are described.

Figure 7:
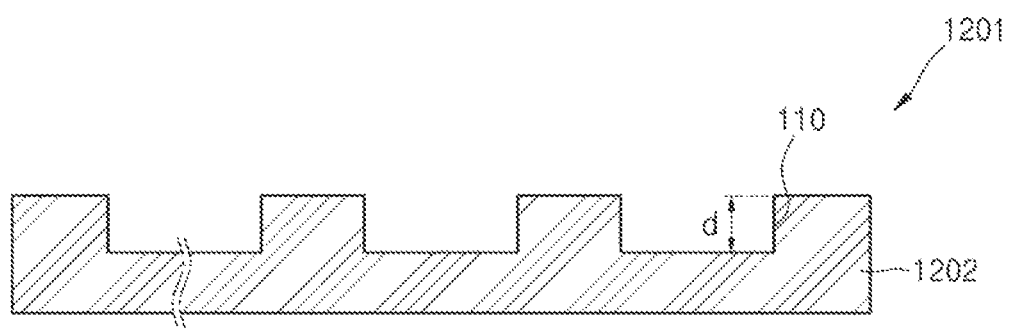
FIGS. 7 through 11 illustrate various examples of a transfer substrate of a display transfer structure, according to an example embodiment.

Referring to FIG. 7, a transfer substrate 1201 may be a substrate 1202 having a single body or a single mold structure including the plurality of grooves 110. The substrate 1202 may include, for example, an organic material, an inorganic material, and/or metal, such as silicon, glass, sapphire, a polymer, etc., and may be formed by photoresist patterning, etching, molding, etc. However, the substrate 1202 is not limited thereto. The groove 110 may guide the transfer of a micro-semiconductor chip, when the micro-semiconductor chip is transferred onto the transfer substrate 1201.

The groove 110 may have a greater cross-sectional area than the micro-semiconductor chip so as to accommodate the micro-semiconductor chip. The groove 110 may have a cross-sectional area for accommodating one micro-semiconductor chip or a plurality of micro-semiconductor chips. The groove 110 may have a similar cross-sectional shape as the micro-semiconductor chip. For example, the groove 110 may have a circular cross-section or a polygonal cross-section. The groove 110 may have a depth that is less than or greater than a thickness of the micro-semiconductor chip. For example, the groove 110 may have a depth d that is less than 2 times the thickness of the micro-semiconductor chip or a depth d corresponding to a range between 0.5 times and 1.5 times the thickness of the micro-semiconductor chip. A bottom surface of the groove 110 may have a roughness that is equal to or less than about 50 nm.

Figure 8:
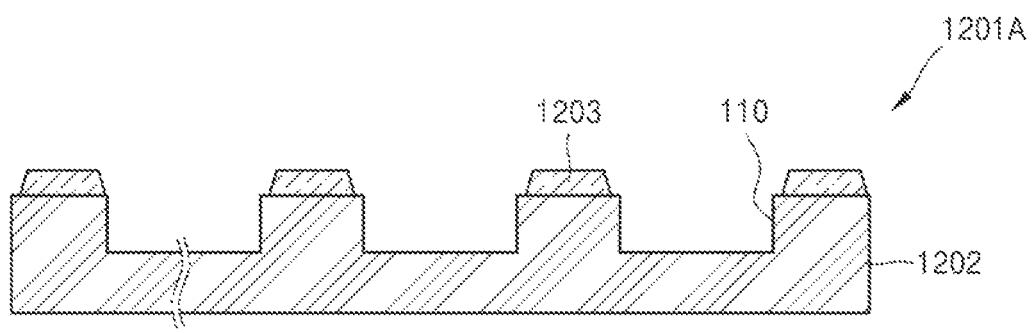

Referring to FIG. 8, a transfer substrate 1201A may further include a metal layer 1203 on a surface of the substrate 1202. The metal layer 1203 may include Ag, Au, Pt, Ni, Cr, and/or Al and may have a different surface energy from the substrate 1202. A polymer may further be coupled to the metal layer 1203. A difference of the surface energies between the metal layer 1203 and the substrate 1202 may facilitate transferring of the micro-semiconductor chips onto the grooves 110, and may also make remaining micro-semiconductor chips easily removable from the transfer substrate 1201A in a cleaning operation, in a case in which some of the micro-semiconductor chips are not transferred onto the grooves 110 and instead remain on the transfer substrate 1201A after the completion of the transfer process. To secure a large surface energy difference, the metal layer 1203 may be selected from hydrophobic materials, and the grooves 110 may be selected from hydrophilic materials.

Figure 9:
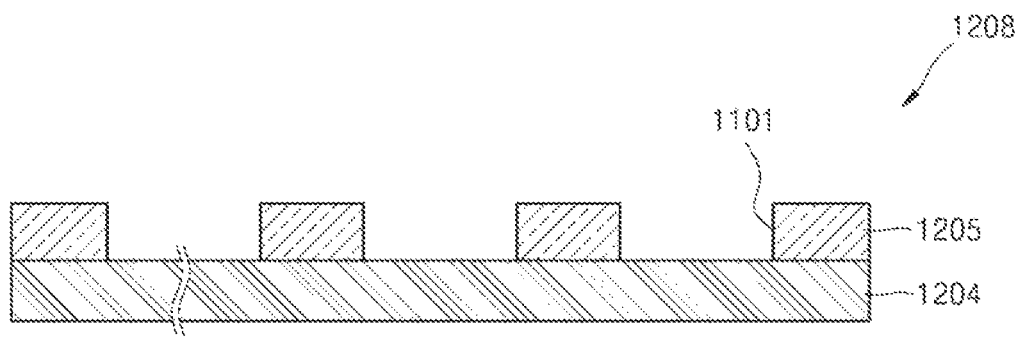
Figure 10:
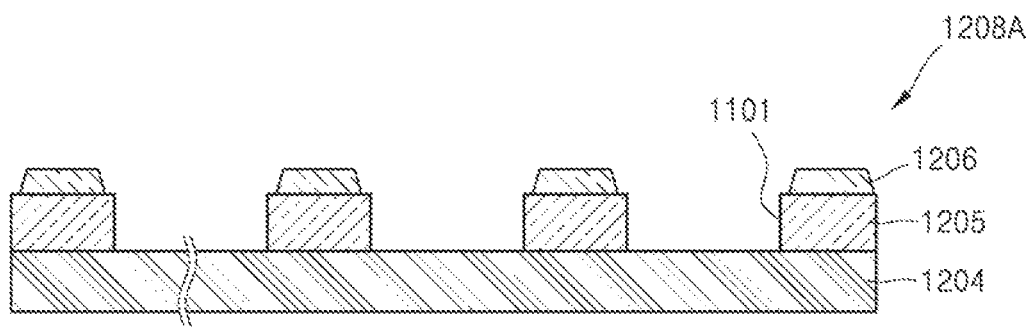

Referring to FIG. 9, a transfer substrate 1208 may include a substrate 1204 and a transfer mold 1205 provided on a surface of the substrate 1204. The transfer mold 1205 may include a plurality of grooves 1101 having shapes of through holes or openings. The substrate 1204 may include silicon, glass, and/or sapphire, and the transfer mold 1205 may include $SiO_2$, Si, SiN, and/or a photoresist. Referring to FIG. 10, a transfer substrate 1208A may further include a metal layer 1206 as described above with reference to FIG. 8, on a surface of the transfer mold 1205.

Figure 11:
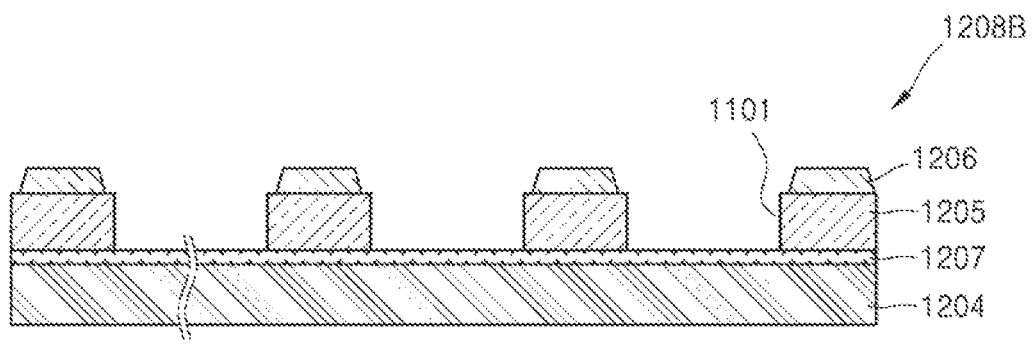

Referring to FIG. 11, a transfer substrate 12088 may further include a dielectric material layer 1207 between the substrate 1204 and the transfer mold 1205 illustrated in FIG. 10. The dielectric material layer 1207 may include, for example, $SiO_2$, SiN, Si, AlN, $Al_2O_3$, and/or $NiO_2$. The dielectric material layer 1207 may have hydrophilic properties and may help the liquid enter the grooves 1101.

Next, various examples of a method of supplying a liquid and a micro-semiconductor chip onto a transfer substrate are described.

Figure 12:
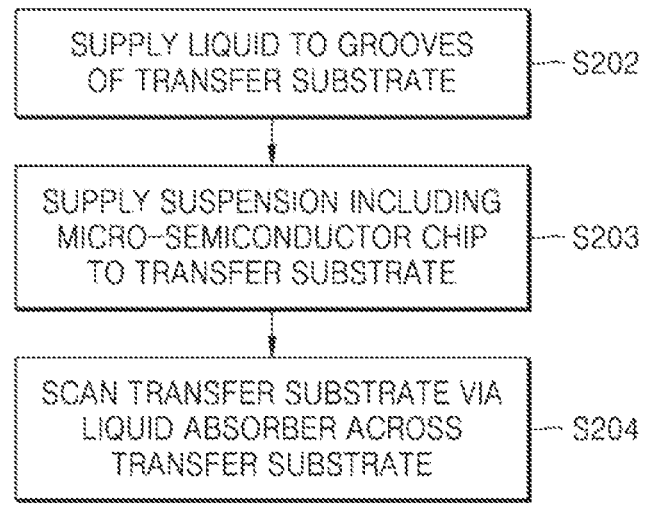
FIGS. 12 and 13 are flowcharts of a wet alignment method for a micro-semiconductor chip, according to an example embodiment.

Referring to FIGS. 12 and 2, a first liquid may be supplied to the grooves 110 of the transfer substrate 120 (operation S202).

After the first liquid is supplied to the grooves 110, a suspension including a second liquid and the micro-semiconductor chips 130 may be supplied to the transfer substrate 120 (operation S203). The first liquid previously supplied to the transfer substrate 120 and the second liquid of the suspension may be the same type of liquid or different types of liquid from each other After the micro-semiconductor chips 130 are supplied onto the transfer substrate 120, the absorber 140 capable of absorbing the liquid may pass across and scan the transfer substrate 120 (operation S204). The absorber and the scanning operation are substantially the same as described with reference to FIGS. 1 through 11, and thus, they are not described in detail here.

Figure 13:
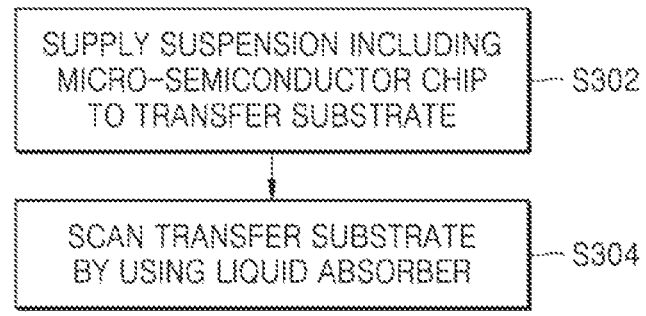
Figure 14:
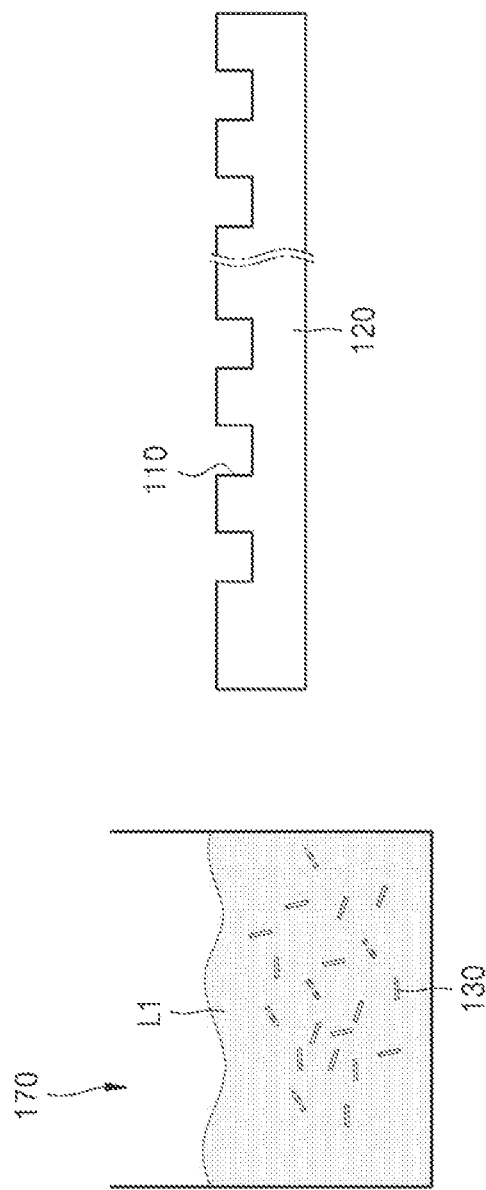
FIG. 14 illustrates a suspension and a transfer substrate that are used for a wet alignment method for a micro-semiconductor chip, according to an example embodiment.

Referring to FIGS. 13 and 14, operation S102 of supplying the liquid onto the transfer substrate may be simultaneously performed with operation S103 of supplying the micro-semiconductor chips 130 illustrated in FIG. 1. In order to simultaneously supply the liquid and the micro-semiconductor chips, a suspension 170 in which the micro-semiconductor chips 130 and a liquid L1 are included may be used. Through operation S302 of supplying the suspension 170 onto the transfer substrate 120, the liquid L1 may be supplied to the grooves 110 of the transfer substrate 120, and the micro-semiconductor chips 130 may be supplied to the transfer substrate 120. Accordingly, there is no need to supply the liquid to the grooves 110 in advance.

Figure 15:
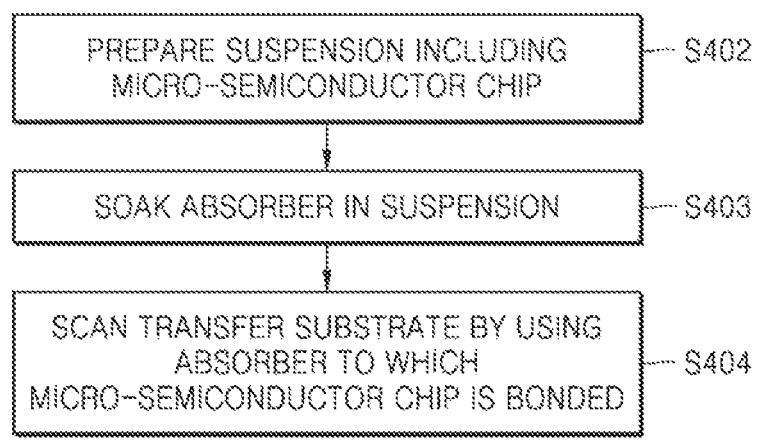
FIG. 15 is a flowchart of a wet alignment method for a micro-semiconductor chip, according to an example embodiment.
Figure 16:
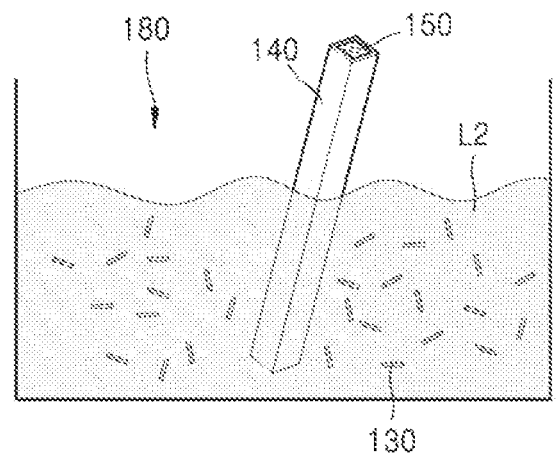
FIG. 16 illustrates a suspension and an absorber that are used for a wet alignment method for a micro-semiconductor chip, according to an example embodiment.

Referring to FIGS. 15 and 16, a suspension 180 in which a liquid L2 and the micro-semiconductor chips 130 are included may be prepared (operation S402) and the absorber 140 may be soaked in the suspension 180 (operation S403). Through this process, the liquid L2 may be absorbed by the absorber 140, and the micro-semiconductor chips 130 may be bonded to a surface of the absorber 140.

The transfer substrate 120 (FIG. 2) may be scanned by using the absorber 140, to which the micro-semiconductor chips 130 are bonded (operation S404). During the scanning operation in which the absorber 140 crosses the transfer substrate 120, the micro-semiconductor chips 130 bonded to the absorber 140 may be supplied onto the transfer substrate 120, and the liquid L2 discharged from the absorber 140 may flow into the grooves 110 at a front row in a scanning direction. Also, while the absorber 140 passes across the grooves 110, the liquid L2 in the grooves 110 may be absorbed again by the absorber 140, and thus, the micro-semiconductor chips 130 may fall from the absorber 140 into the grooves 110 of the transfer substrate 120.

The embodiment described with reference to FIGS. 15 and 16 may also correspond to the case described with reference to FIG. 13, the case describing that the liquid and the micro-semiconductor chips are simultaneously supplied onto the transfer substrate. In a state in which the absorber 140 is soaked with the liquid and holds the micro-semiconductor chips 130, the absorber 140 moves or rolls across the transfer substrate 120 and presses down the transfer substrate 120 while making the movement in a lateral direction. In the process of moving or rolling the absorber 140, the liquid may flow into the grooves 110, and the micro-semiconductor chips 130 may enter the grooves 110 of the transfer substrate 120.

According to the embodiment illustrated in FIGS. 15 and 16, there may be no need to additionally supply a liquid to the grooves 110 of the transfer substrate 120. However, the liquid may also be supplied to the grooves 110 in advance. Also, while repeatedly scanning the transfer substrate 120 by using the scanner 140, the supplying of the liquid to the grooves 110 of the transfer substrate 120 may be additionally performed according to necessity.

Figure 17:
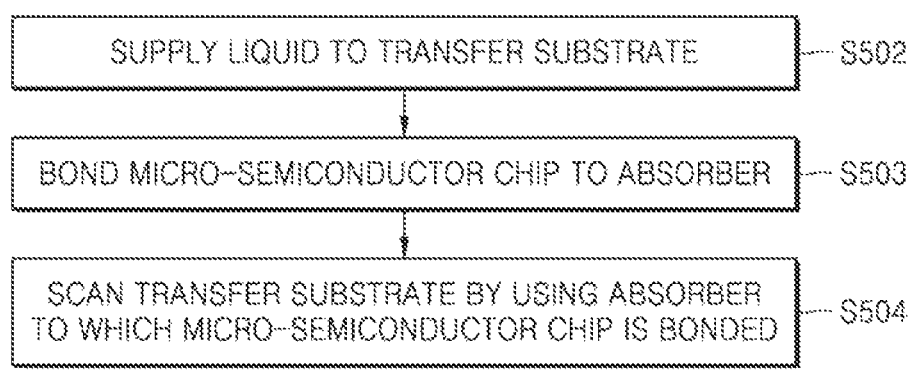
FIG. 17 is a flowchart of a wet alignment method for a micro-semiconductor chip, according to an example embodiment.
Figure 18:
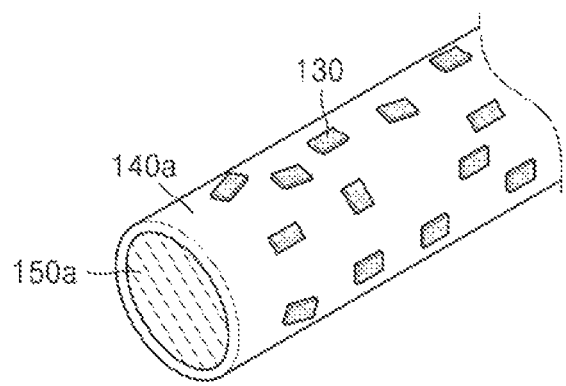
FIG. 18 illustrates an example of a state in which a micro-semiconductor chip is bonded to an absorber used for a wet alignment method for a micro-semiconductor chip, according to an example embodiment.

FIG. 17 illustrates a wet alignment method for a micro-semiconductor chip, according to an example embodiment. A liquid may be supplied to the transfer substrate 120 (operation S502), and then, as illustrated in FIG. 18, the micro-semiconductor chips 130 may be attached to the absorber 140a (operation S503). For example, when the absorber 140a rubs or contacts the micro-semiconductor chip 130, due to static electricity, etc., the micro-semiconductor chip 130, which is thin, may be attached to the absorber 140a. The absorber 140a to which the micro-semiconductor chip 130 is attached may scan the transfer substrate 120 (operation S504).

When the absorber 140a scans the transfer substrate 120, the micro-semiconductor chips 130 may be supplied onto the transfer substrate 120, and the liquid in the grooves 110 may be absorbed by the absorber 140a, and thus, the micro-semiconductor chips 130 may enter the grooves 110.

Figure 19:
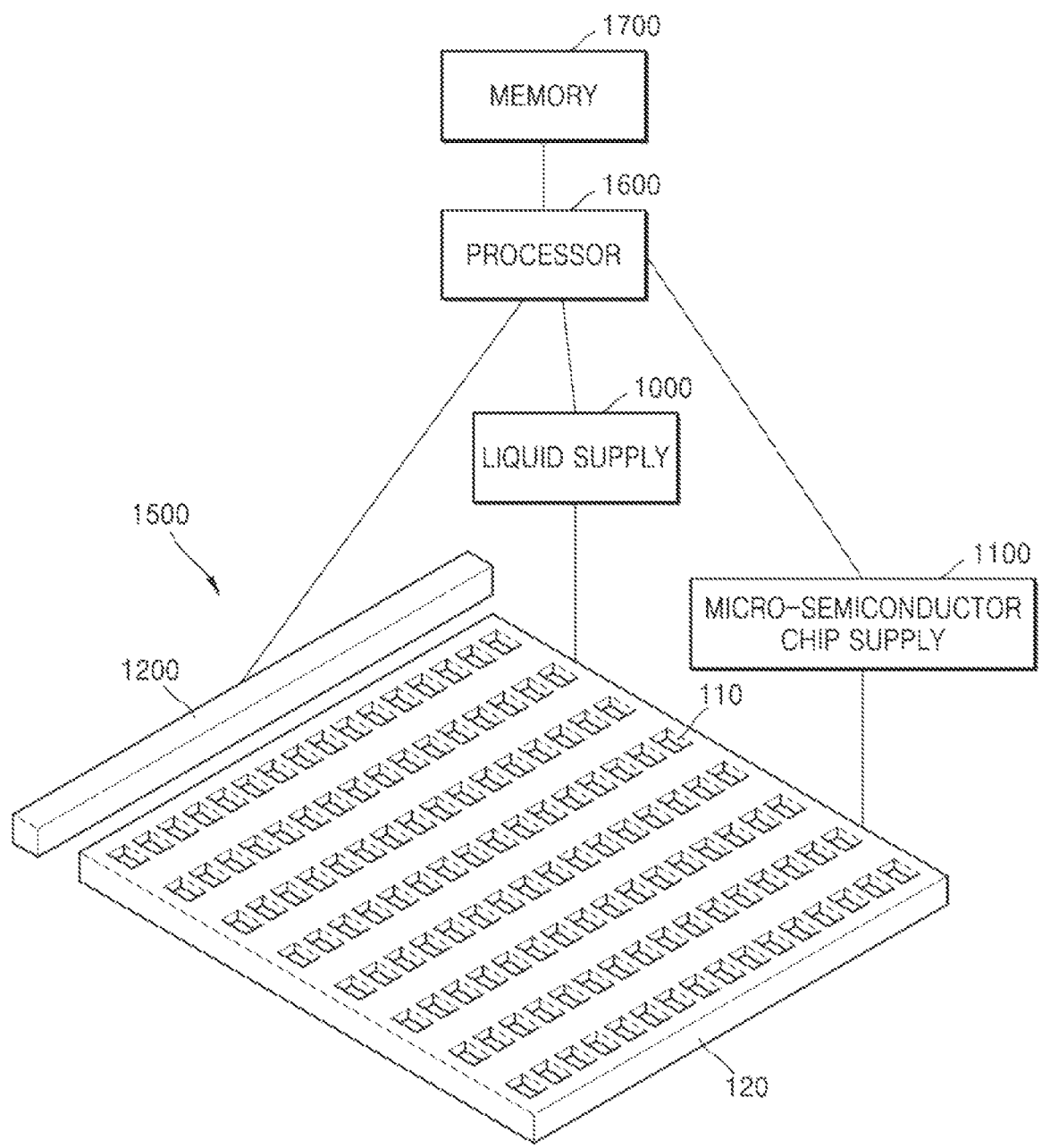
FIG. 19 schematically illustrates a wet alignment device for a micro-semiconductor chip, according to an example embodiment.

FIG. 19 illustrates a wet alignment device for a micro-semiconductor chip 1500, according to an example embodiment.

The wet alignment device for a micro-semiconductor chip 1500 may include a liquid supply 1000 configured to supply a liquid to the transfer substrate 120 including the plurality of grooves 110, a micro-semiconductor chip supply 1100 configured to supply micro-semiconductor chips onto the transfer substrate 120, and an absorber 1200 configured to absorb the liquid. The wet alignment device may further include a processor 1600 configured to control movements and operations of the liquid supply 1000, the micro-semiconductor chip supply 1100, and the absorber 1200, and a memory 1700 configured to store computer-readable instructions that are executed by the processor 1600 to control the liquid supply 1000, the micro-semiconductor chip supply 1100, and the absorber 1200, for example, to perform operations S101-S105, S1041-S1042, S202-S204, S302-304, S402-S404, and S502-S504.

The liquid supply 1000 and the micro-semiconductor chip supply 1100 may include a switch or a valve that is adapted to open or close a liquid supply path of the liquid supply 1000 and a chip supply path of the micro-semiconductor chip supply 1100, according to an electrical signal from the processor 1600. The absorber 1200 may be coupled with a motor and/or a rotation shaft that is operated according to an electrical signal from the processor 1600. The motor and the rotation shaft may move the absorber 1200 across the transfer substrate 120.

The liquid supply 1000 may include a liquid sprayer, a liquid spreader, a liquid dispenser, an inkjet dot spreader, a liquid diffuser, or the like. Provided that the liquid supply 1000 may appropriately supply a liquid to the transfer substrate 120, a shape or a structure of the liquid supply 1000 is not particularly limited.

The micro-semiconductor chip supply 1100 may supply the micro-semiconductor chips onto the transfer substrate 120 based on various methods, for example, by sprinkling or dispensing the micro-semiconductor chips on the transfer substrate 120. When a suspension is supplied to the transfer substrate 120, the liquid supply 1000 and the micro-semiconductor chip supply 1100 may be configured as a single body. Even when the micro-semiconductor chip supply 1100 supplies the suspension to the transfer substrate 120, an additional liquid may also be supplied to the transfer substrate 120 in advance.

The absorber 1200 may absorb the liquid in the grooves 110 while scanning the transfer substrate 120. The absorber 1200 may include any types of materials capable of absorbing a liquid, for example, fabric such as cotton or wool, a tissue, a polyester fiber, paper, and/or a wiper.

Figure 20:
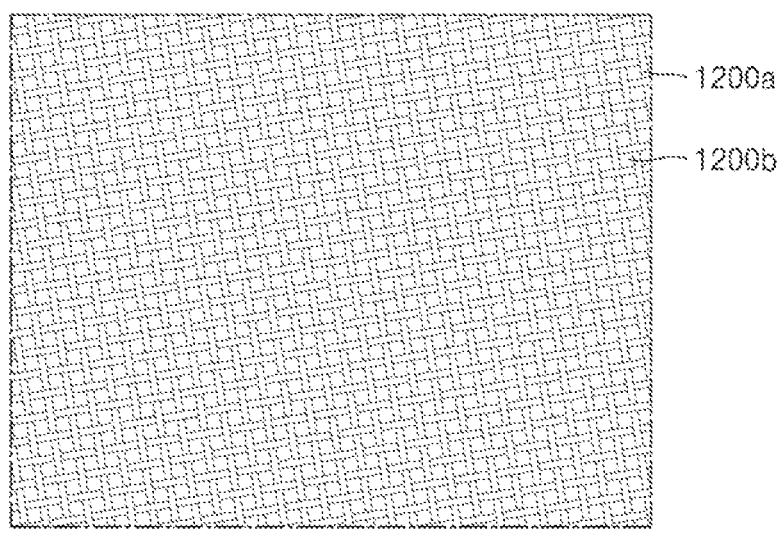
FIG. 20 illustrates an example of an absorber of a wet alignment device for a micro-semiconductor chip, according to an example embodiment.

FIG. 20 is an enlarged view of fabric 1200a, as an example of an absorber. The fabric 1200a may have a gap 1200b that is less than a micro-semiconductor chip, so that the micro-semiconductor chip is not caught or stuck in the gap 1200b.

Figure 21:
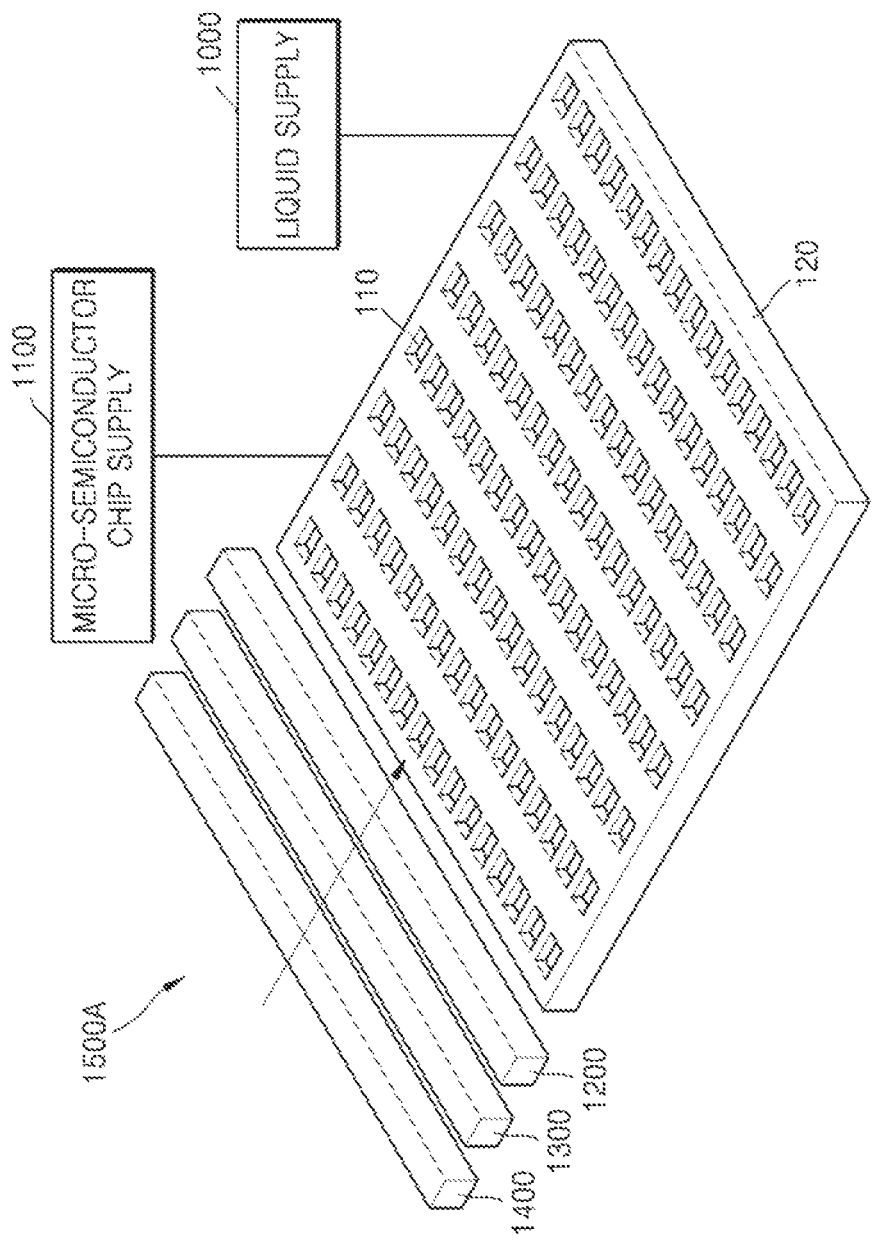
FIG. 21 schematically illustrates a wet alignment device for a micro-semiconductor chip, according to an example embodiment.

FIG. 21 illustrates a wet alignment device for a micro-semiconductor chip 1500A, according to another example embodiment.

The wet alignment device for a micro-semiconductor chip 1500A may include the liquid supply 1000, the micro-semiconductor chip supply 1100, and the absorber 1200 as described above with reference to FIG. 19. Additionally, the wet alignment device for a micro-semiconductor chip 1500A may include a pre-bonder 1300. The pre-bonder 1300 may apply heat for pre-bonding, to the transfer substrate 120, micro-semiconductor chips mounted in the grooves 100 of the transfer substrate 120. The pre-bonder 1300 may include a lamp or a heater. Also, the wet alignment device for a micro-semiconductor chip 1500A may further include a cleaner 1400 configured to remove a dummy micro-semiconductor chip remaining after the micro-semiconductor chips are transferred onto the transfer substrate 120.

An operation in which micro-semiconductor chips are transferred according to a wet alignment method for a micro-semiconductor chip according to an example embodiment is described.

Figure 22:
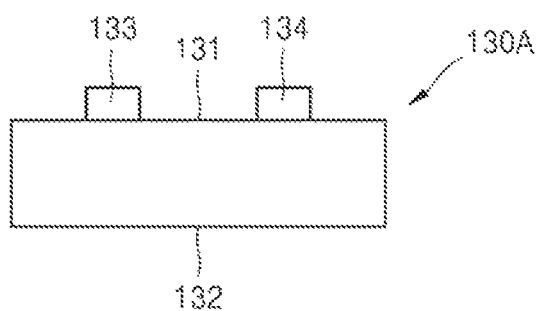
FIG. 22 schematically illustrates a micro-semiconductor chip having a horizontal electrode structure.

Referring to FIG. 22, a micro-semiconductor chip 130A may have a horizontal electrode structure in which a negative electrode and a positive electrode are provided on a surface of the micro-semiconductor chip 130A. The micro-semiconductor chip 130A may include a first surface 131 and a second surface 132 that is the opposite to the first surface 131, and a first electrode 133 and a second electrode 134 may be arranged on the first surface 131 to be apart from each other. The first and second electrodes 133 and 134 may include, for example, metal, such as Al, Au, Pt, Mo, Cu, Ag, and/or Zn, wherein the first electrode 133 may be a positive electrode, and the second electrode 134 may be a negative electrode.

Figure 23:
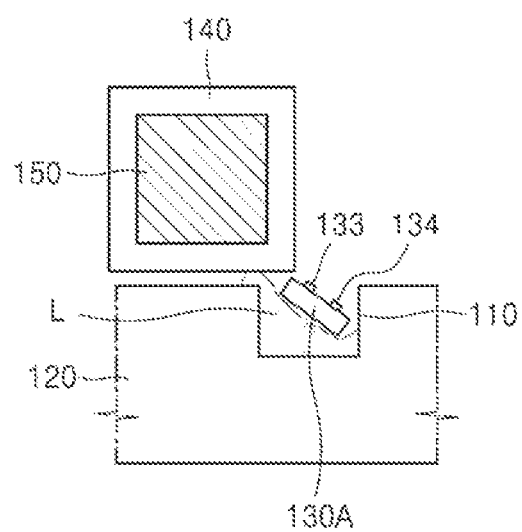
FIGS. 23 and 24 illustrate a process in which a micro-semiconductor chip having a horizontal electrode structure is aligned.

FIG. 23 illustrates an operation in which the micro-semiconductor chip 130A having the horizontal electrode structure is transferred onto the transfer substrate 120.

Referring to FIG. 23, in a scanning process, the liquid L may be absorbed by the absorber 140, and the micro-semiconductor chip 130A may be moved to be mounted in the groove 110. The first and second electrodes 133 and 134 of the micro-semiconductor chip 130A may have hydrophobic properties, and based on the interaction with the liquid L during the scanning process, the first and second electrodes 133 and 134 may be arranged toward an upper opening of the groove 110. When the micro-semiconductor chip 130A enters the groove 110, the micro-semiconductor chip 130A may be sunk in the liquid L.

Figure 24:
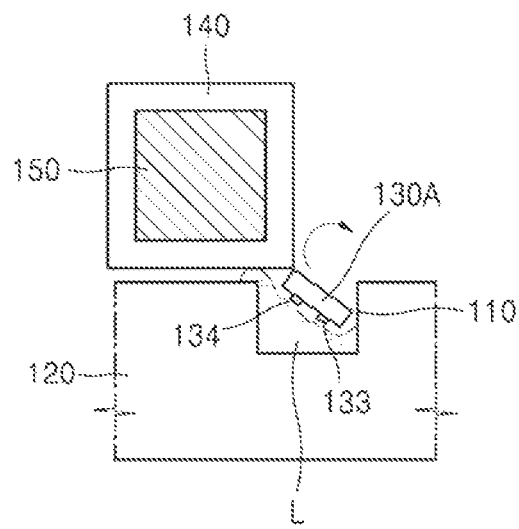

Referring to FIG. 24, when the first and second electrodes 133 and 134 are arranged to face a bottom of the groove 110, the absorber 140 repeatedly moves over the groove 100 containing the flipped-over micro-semiconductor chip 130A to absorb and change the flow of the liquid during a scanning process, and thereby to turn over the first and second electrodes 133 and 134 to face an upper opening of the groove 110. FIG. 24 illustrates that the micro-semiconductor chip 130A floats over the liquid L. However, the micro-semiconductor chip 130A may be sunk in the liquid L.

Figure 25:
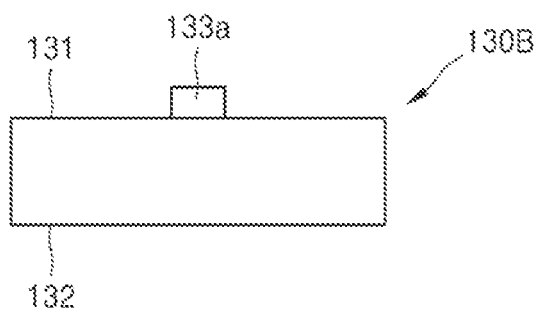
FIG. 25 schematically illustrates a micro-semiconductor chip having a vertical electrode structure.

Referring to FIG. 25, a micro-semiconductor chip 130B may include only a first electrode 133a on the first surface 131 and may not include an electrode on the other surface. In the case of the micro-semiconductor chip 130B having this vertical electrode structure, the other electrode may be provided in a driving circuit substrate to be described below, rather than the micro-semiconductor chip 130B. The first electrode 133a may have hydrophobic properties, and as described above, may help the micro-semiconductor chip 130B enter the grooves 110 in a predetermined direction during a scanning process.

Figure 26:
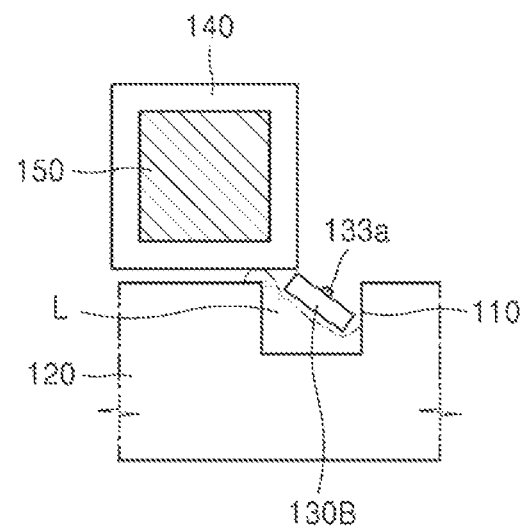
FIGS. 26 and 27 illustrate a process in which a micro-semiconductor chip having a vertical electrode structure is aligned.
Figure 27:
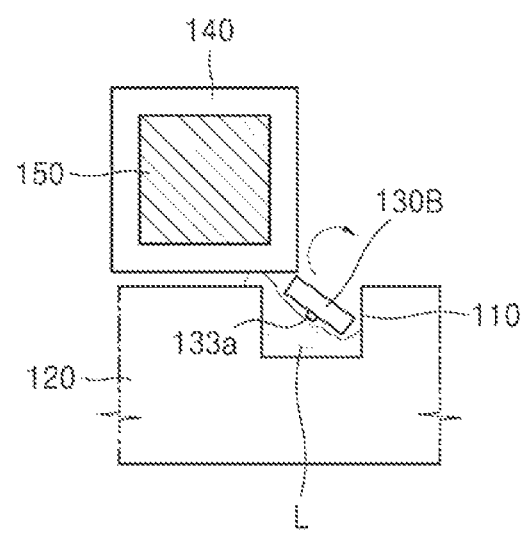

FIGS. 26 and 27 illustrate an operation in which a micro-semiconductor chip having a vertical electrode structure is transferred. The transfer operation and principle are the same as described with reference to FIGS. 23 and 24, and thus, detailed description thereof will not be given.

Figure 28:
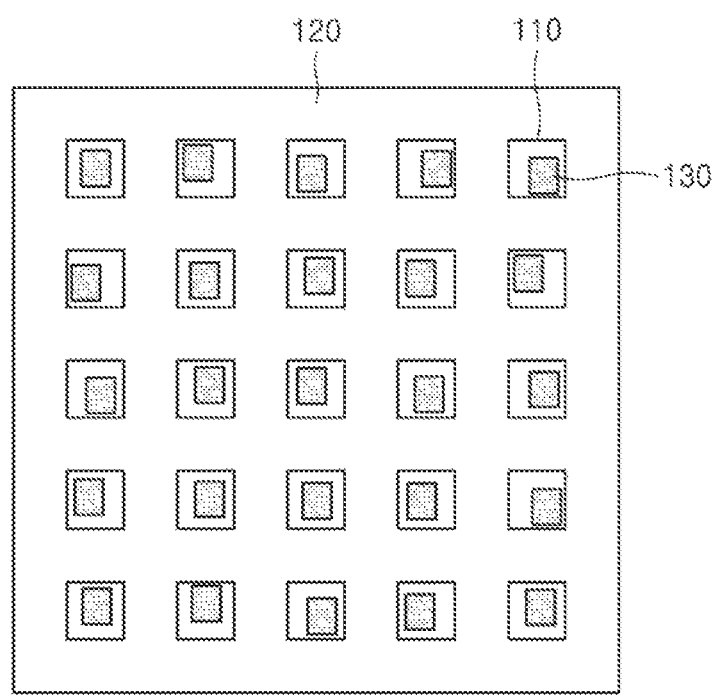
FIG. 28 is a plan view of a display transfer structure according to an example embodiment.

FIG. 28 illustrates an example in which the micro-semiconductor chips 130 are aligned on the transfer substrate 120.

According to the wet alignment method described above, the micro-semiconductor chips 130 that are transferred may be irregularly and randomly arranged in the grooves 110 of the transfer substrate 120. While micro-semiconductor chips aligned according to a previous stamping method are arranged in regular locations of grooves of a transfer substrate, the micro-semiconductor chips 130 aligned according to embodiments of the disclosure may be arranged in irregular locations of the grooves 110 of the transfer substrate 120. However, after micro-semiconductor chips are completely transferred and dummy micro-semiconductor chips that are not arranged in the grooves 110 are removed, a transfer substrate may be scanned more than once by using a clean absorber to reduce the irregularity of the micro-semiconductor chips that are irregularly arranged.

Figure 29:
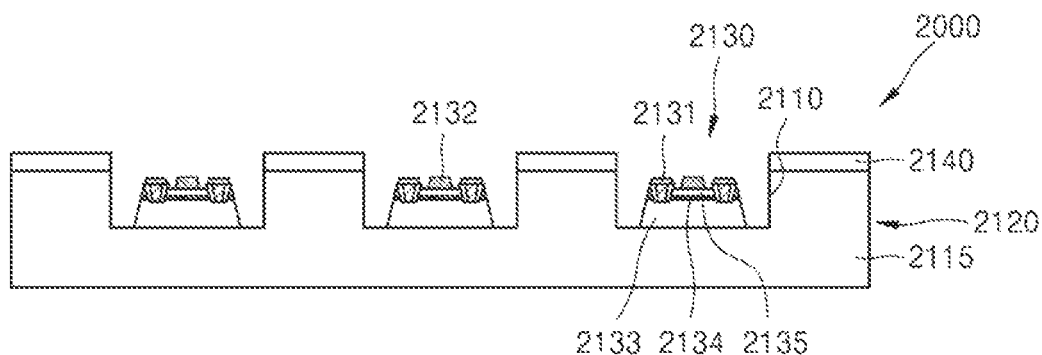
FIG. 29 is a cross-sectional view of a display transfer structure according to another example embodiment.

FIG. 29 is a schematic view of a display transfer structure 2000 according to an example embodiment.

The display transfer structure 2000 may include a transfer substrate 2120. The transfer substrate 2120 may include a substrate 2115 having a plurality of grooves 2110, and micro-semiconductor chips 2130 provided in the plurality of grooves 2110.

The micro-semiconductor chip 2130 may include a first electrode 2131 and a second electrode 2132 on a surface thereof toward an upper opening of the groove 2110 and may not include an electrode on a surface thereof toward a bottom of the groove 2110. The micro-semiconductor chip 2130 may include an n-type semiconductor layer 2133, an active layer 2134, and a p-type semiconductor layer 2135. The n-type semiconductor layer 2133 may be an n-type GaN layer, and the p-type semiconductor layer 2135 may be a p-type GaN layer. The active layer 2134 may include, for example, a quantum-well structure or a multi-quantum-well structure. The transfer substrate 2120 may further include a metal layer 2140 on an upper surface of the substrate 2115. The metal layer 2140 may include Ag, Au, Pt, Ni, Cr, and/or Al, and, as described above, may help the dummy micro-semiconductor chips be easily removed from the transfer substrate 2120.

As illustrated in FIG. 29, the transfer substrate 2120 may be formed as a single body or may further include the metal layer 2140. However, various other structures may be possible. Various examples of the transfer substrate 2120 are the same as described with reference to FIGS. 7 through 11, and thus, they will not be described in detail.

Figure 30:
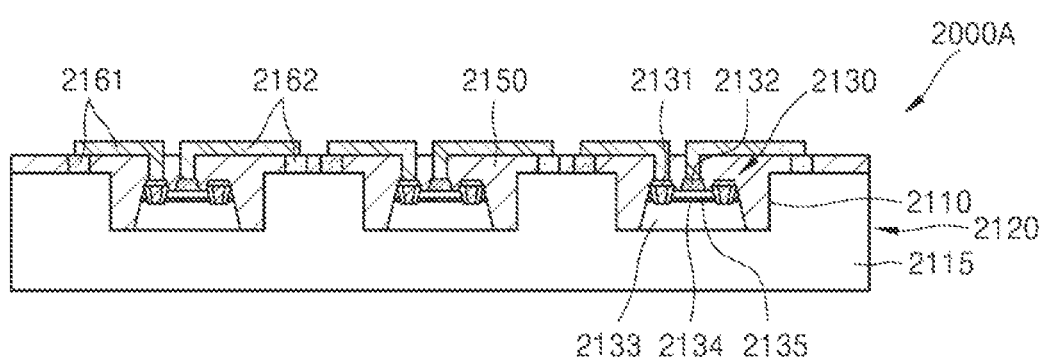
FIG. 30 is a cross-sectional view of a display transfer structure according to another example embodiment.

FIG. 30 illustrates an example in which another layer is further included in the display transfer structure 2000 illustrated in FIG. 29. Components that are the same as the display transfer structure 2000 illustrated in FIG. 29 are not described in detail.

A display transfer structure 2000A may include an insulating layer 2150 provided on the transfer substrate 2120 and driving circuits 2161 and 2162 provided on the insulating layer 2150 and connected to the first electrode 2131 and the second electrode 2132. FIG. 30 illustrates an example in which the driving circuits 2161 and 2162 are provided above the transfer substrate 2120. However, the driving circuits 2161 and 2162 may be provided below the transfer substrate 2120. Each of three micro-semiconductor chips 2130 included in the display transfer structure 2000A may emit different color light. For example, each of the three micro-semiconductor chips 2130 may emit red light R, green light G, or blue light B, and the transfer structure 2000A having this structure may be applied to an RGB self-emitting micro-LED television (TV).

Figure 31:
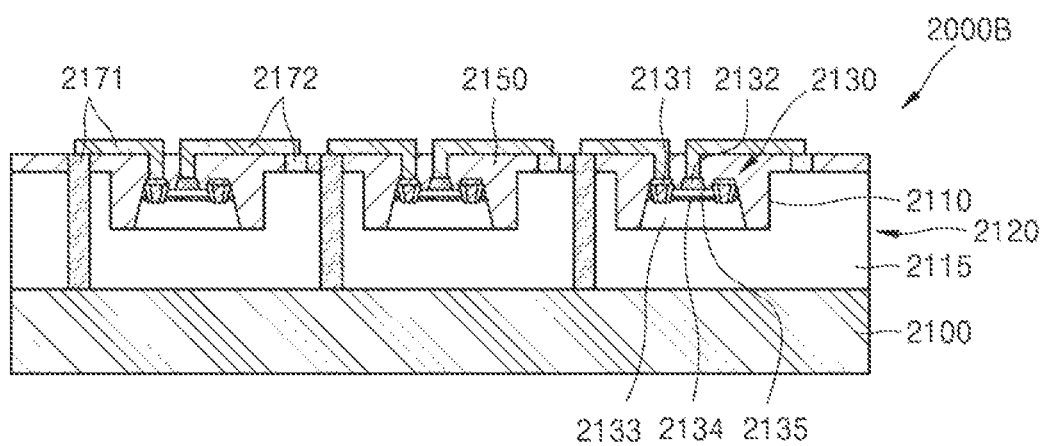
FIG. 31 is a cross-sectional view of a display transfer structure according to another example embodiment.

FIG. 31 illustrates an example in which a driving circuit substrate is further included in the display transfer structure 2000A of FIG. 30.

In FIG. 31, the components referred to by using the same reference numerals as the components of FIG. 30 have substantially the same functions and structures as described with reference to FIG. 30, and thus, their detailed descriptions are omitted here.

A display transfer structure 2000B may include a driving circuit substrate 2100 below the transfer substrate 2120. The driving circuit substrate 2100 may include a driving transistor, a switching transistor, and a capacitor. The display transfer structure 2000B may include driving circuits 2171 and 2172 provided on the insulating layer 2150 and connected to the first and second electrodes 2131 and 2132, and the driving circuit 2171 may be connected to the driving circuit substrate 2100.

Figure 32:
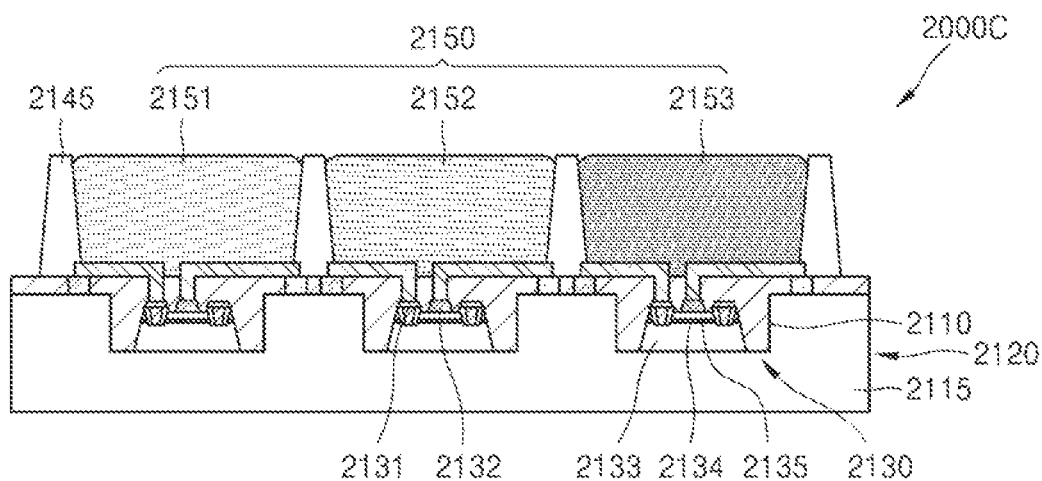
FIG. 32 illustrates an example in which a color conversion layer is further included in the display transfer structure illustrated in FIG. 30.

FIG. 32 illustrates an example in which a color conversion layer is further included in the display transfer structure 2000A of FIG. 30. In FIG. 32, the components referred to by using the same reference numerals as the components of FIG. 30 have substantially the same functions and structures as described with reference to FIG. 30, and thus, their detailed descriptions are omitted here.

A display transfer structure 2000C may include partition walls 2145 provided on the insulating layer 2150 to be apart from each other, and a color conversion layer 2150 provided between the partition walls 2145. The color conversion layer 2150 may convert a color of the light emitted from the micro-semiconductor chip 2130. The micro-semiconductor chip 2130 may emit first color light, for example, blue light. However, it is only an example. The micro-semiconductor chip 2130 may emit light of other wavelength ranges that may excite the color conversion layer 2150.

The color conversion layer 2150 may include a first color conversion layer 2151 configured to convert the light from the micro-semiconductor chip 2130 into first color light, a second color conversion layer 2152 configured to convert the light from the micro-semiconductor chip 2130 into second color light, and a third color conversion layer 2153 configured to convert the light from the micro-semiconductor chip 2130 into third color light. The second color light may include, for example, green light, and the third color light may include, for example, red light.

When the micro-semiconductor chip 2130 emits blue light, the first color conversion layer 2151 may include a resin that transmits the blue light without color conversion. The second color conversion layer 2152 may emit green light by converting the blue light emitted from the micro-semiconductor chip 2130. The second color conversion layer 2152 may include quantum dots (QD) that are excited by the blue light and emit the green light, and the QDs may have a core-shell structure having a core portion and a shell portion or may have a particle structure without a shell. The core-shell structure may include a single-shell structure or a multi-shell structure, for example, a double-shell structure.

The QDs may include, for example, Groups II-VI-based semiconductors, Groups III-V-based semiconductors, Groups IV-VI-based semiconductors, Groups IV-based semiconductors, and/or graphene QDs. The QDs may include, for example, Cd, Se, Zn, S, and/or InP, and each QD may have a diameter that is equal to or less than about dozens of nm, for example, a diameter that is equal to or less than about 10 nm.

The second color conversion layer 2152 may include a phosphor excited by the blue light emitted from the micro-semiconductor chip 2130 and emitting the green light.

The third color conversion layer 2153 may emit red light by changing the blue light emitted from the micro-semiconductor chip 2130 into the red light. The third color conversion layer 2153 may include QDs having a predetermined size, the QDs being excited by the blue light and emitting the red light, or may include a phosphor excited by the blue light emitted from the micro-semiconductor chip 2130 and emitting the red light.

Figure 33:
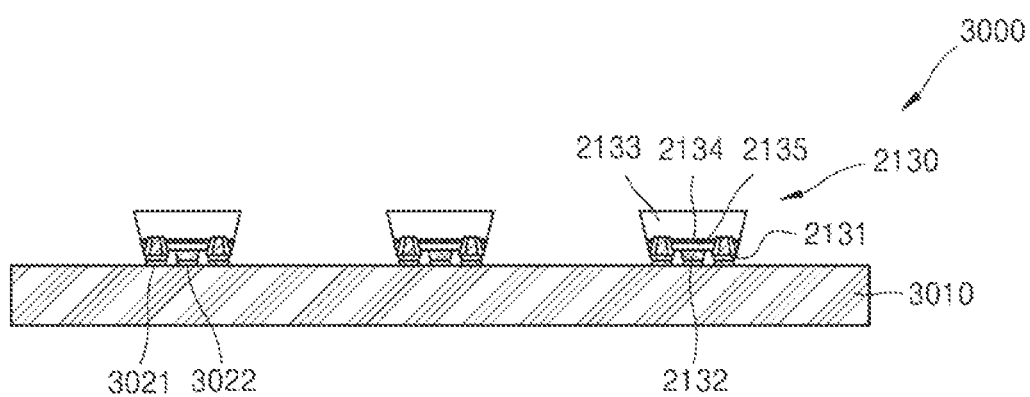
FIG. 33 is a cross-sectional view of a display transfer structure according to another example embodiment.

FIG. 33 illustrates a display transfer structure 3000 according to another example embodiment.

The display transfer structure 3000 may include a driving circuit substrate 3010 including a transistor and a capacitor. The micro-semiconductor chips 2130 aligned on the transfer substrate 2120 illustrated in FIG. 29 may be transferred and bonded to the driving circuit substrate 3010. The driving circuit substrate 3010 may include a first circuit 3021 and a second circuit 3022, and when the micro-semiconductor chips 2130 are transferred onto the driving circuit substrate 3010, the first electrode 2131 may be connected to the first circuit 3021, and the second electrode 2132 may be connected to the second circuit 3022.

Figure 34:
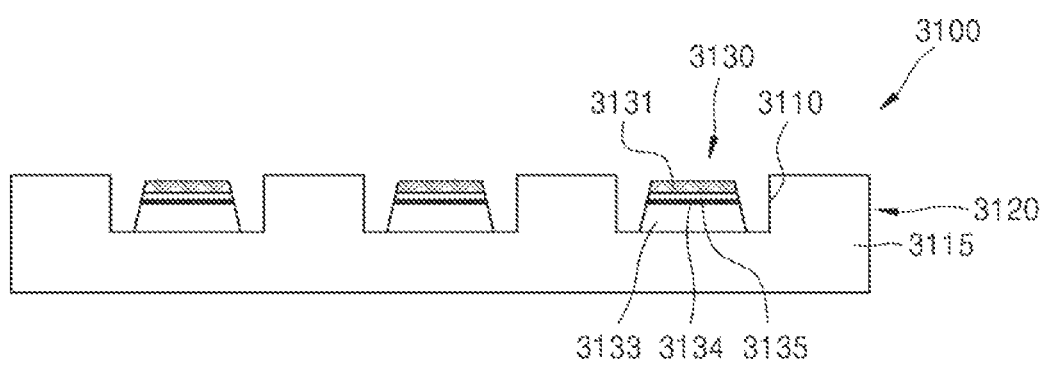
FIGS. 34 through 36 are cross-sectional views of a display transfer structure according to another example embodiment.

FIG. 34 illustrates a display transfer structure 3100 according to another example embodiment.

The display transfer structure 3100 may include a transfer substrate 3120 including a substrate 3115 including a plurality of grooves 3110 and micro-semiconductor chips 3130 respectively provided in the plurality of grooves 3110. The micro-semiconductor chip 3130 may include an electrode 3131 on a surface thereof toward an upper opening of the groove 3110, and may not include an electrode on a surface thereof toward a bottom of the groove 3110.

The micro-semiconductor chip 3130 may include an n-type semiconductor layer 3133, an active layer 3134, and a p-type semiconductor layer 3135. The n-type semiconductor layer 3133 may be an n-type GaN layer, the p-type semiconductor layer 3135 may be a p-type GaN layer, and the active layer 3134 may have a quantum well structure or a multi-quantum well structure.

Figure 35:
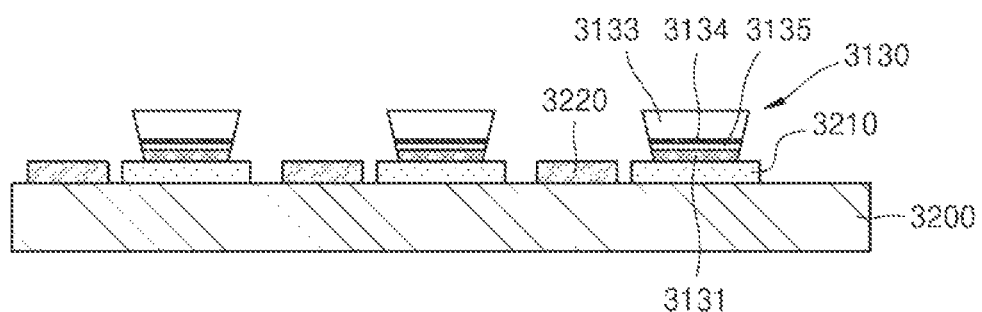

Referring to FIG. 35, the micro-semiconductor chips 3130 aligned on the transfer substrate 3120 illustrated in FIG. 34 may be transferred onto a driving circuit substrate 3200. The driving circuit substrate 3200 may include a first circuit 3210 and a second circuit 3220, and the first electrode 313 of the micro-semiconductor chip 3130 may be connected to the first circuit 3210.

Figure 36:
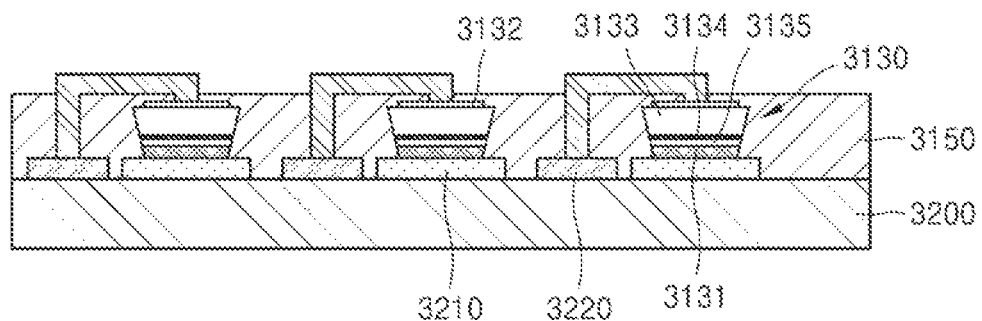

Referring to FIG. 36, an insulating layer 3150 may be provided in the display transfer structure illustrated in FIG. 35. A second electrode 3132 may be formed in the micro-semiconductor chip 3130 by patterning the insulating layer 3150, and the second electrode 3132 may be connected to the second circuit 3220.

In the display transfer structure according to an example embodiment, one groove may be provided in a region corresponding to one pixel, or a plurality of grooves may be provided in the region corresponding to one pixel.

Figure 37:
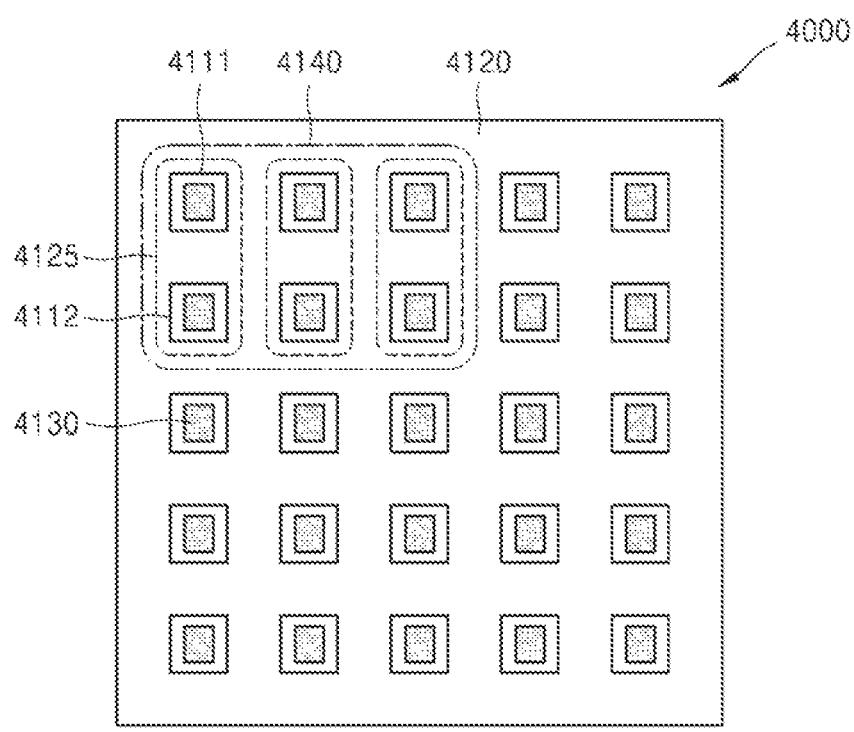
FIGS. 37 through 41 illustrate various alignment structures of micro-semiconductor chips of display transfer structures, according to example embodiments.

FIG. 37 illustrates a display transfer structure 4000 according to another example embodiment.

The display transfer structure 4000 may include a transfer substrate 4120 including a plurality of grooves and micro-semiconductor chips 4130 respectively provided in the grooves. The transfer substrate 4120 may include regions 4125 respectively corresponding to sub-pixels and each of the regions 4125 may include a plurality of grooves. A pixel may indicate a basic unit for displaying a color in a display apparatus, and a region 4140 corresponding to a pixel may include the regions 4125 corresponding to the plurality of sub-pixels. For example, a pixel may include a first sub-pixel emitting red first color light, a second sub-pixel emitting green second color light, and a third sub-pixel emitting blue third color light. Each region 4125 corresponding to a sub-pixel may include one or more micro-semiconductor chips 4130.

For example, each region 4125 may include a first groove 4111 and a second groove 4112, and the micro-semiconductor chip 4130 may be provided in each of the first groove 4111 and the second groove 4112. Like this, when the plurality of grooves, that is, the first and second grooves 4111 and 4112, are provided in each region 4125, even when leakage of the micro-semiconductor chip 4130 occurs in any one of the plurality of grooves, that is, the first and second grooves 4111 and 4112, the micro-semiconductor chip 4130 may be provided in the remaining grooves, and thus, an error rate and a repair process may be reduced.

For example, the micro-semiconductor chip 4130 may have a size that is equal to or less than 200 μm. A size of the micro-semiconductor chip 4130 may be indicated by a maximum diameter of a cross-sectional plane perpendicular to a direction in which light is emitted. The micro-semiconductor chip 4130 and the first and second grooves 4111 and 4112 may have variously shaped cross-sections, for example, a triangular cross-section, a square cross-section, a circular cross-section, etc. Also, the first and second grooves 4111 and 4112 may have sizes corresponding to the number of micro-semiconductor chips 4130 according to necessity.

Figure 38:
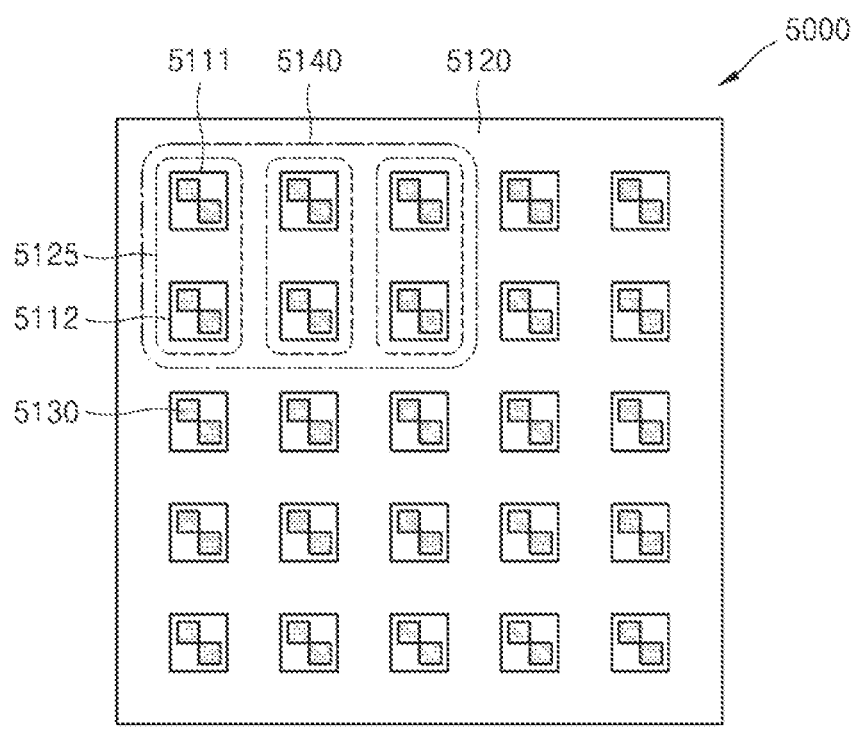

FIG. 38 illustrates a display transfer structure 5000 according to another example embodiment.

Figure 39:
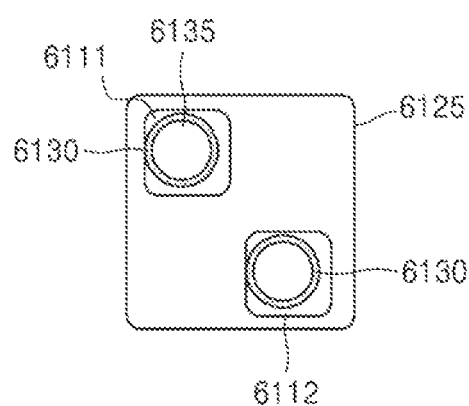
Figure 40:
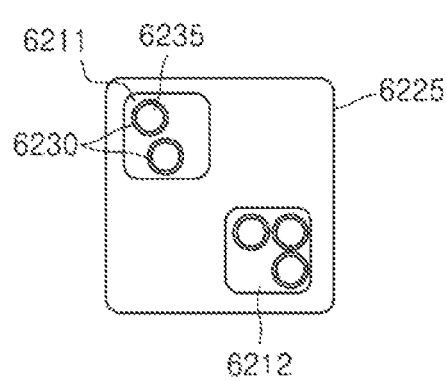
Figure 41:
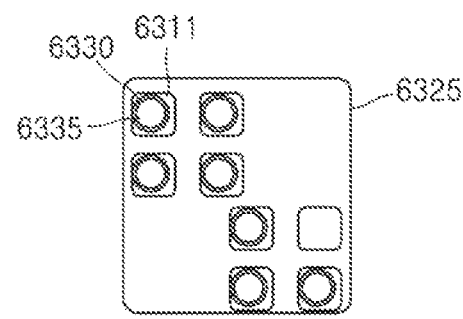

The display transfer structure 5000 may include a transfer substrate 5120, and the transfer substrate 5120 may include a region 5140 corresponding to a pixel. The region 5140 may include a plurality of regions 5125 respectively corresponding to sub-pixels. A difference between the display transfer structure 5000 and the display transfer structure 4000 according to the embodiment illustrated in FIG. 37 is that grooves 5111 and 5112 may have sizes to accommodate a plurality of micro-semiconductor chips 5130, wherein the sizes of the grooves 5111 and 5112 may be indicated by a cross-sectional area. For example, each of the first and second grooves 5111 and 5112 may have a size to accommodate two or more micro-semiconductor chips 5130. FIGS. 39 through 41 are enlarged views of various examples in which micro-semiconductor chips are arranged in a region of a transfer substrate, the region corresponding to a sub-pixel.

Referring to FIG. 39, a first groove 6111 and a second groove 6112 may be provided in a region 6125 corresponding to a sub-pixel, and a micro-semiconductor chip 6130 may be provided in each of the first and second grooves 6111 and 6112. The micro-semiconductor chip 6130 may have a circular cross-section, and an electrode 6135 may be located toward an upper opening of the first and second grooves 6111 and 6112.

The first and second grooves 6111 and 6112 may be arranged in a diagonal direction of the region 6125, and in this case, the probability of leakage of the micro-semiconductor chip 6130 may be reduced compared to a case where the first and second grooves 6111 and 6112 are serially arranged.

Referring to FIG. 40, first and second grooves 6211 and 6212 may be provided in a region 6225 corresponding to a sub-pixel, and a plurality of micro-semiconductor chips 6230 may be provided in each of the first and second grooves 6211 and 6212. The first and second grooves 6211 and 6212 may have sizes to accommodate the plurality of micro-semiconductor chips 6230, and an electrode 6235 may be located toward upper openings of the first and second grooves 6211 and 6212.

Referring to FIG. 41, eight grooves 6311 may be provided in a region 6325 corresponding to a sub-pixel. One micro-semiconductor chip 6330 may be provided in each of the eight grooves 6311, and an electrode 6335 may be located toward an upper opening of each of the grooves 6311. Like this, when the number of grooves 6311 included in the region 6325 corresponding to a sub-pixel is increased, even when leakage of micro-semiconductor chips occurs in one or more grooves, a pixel operation may not be affected, and thus, a defect rate of the pixel may be decreased and a repair operation may be reduced.

Figure 42:
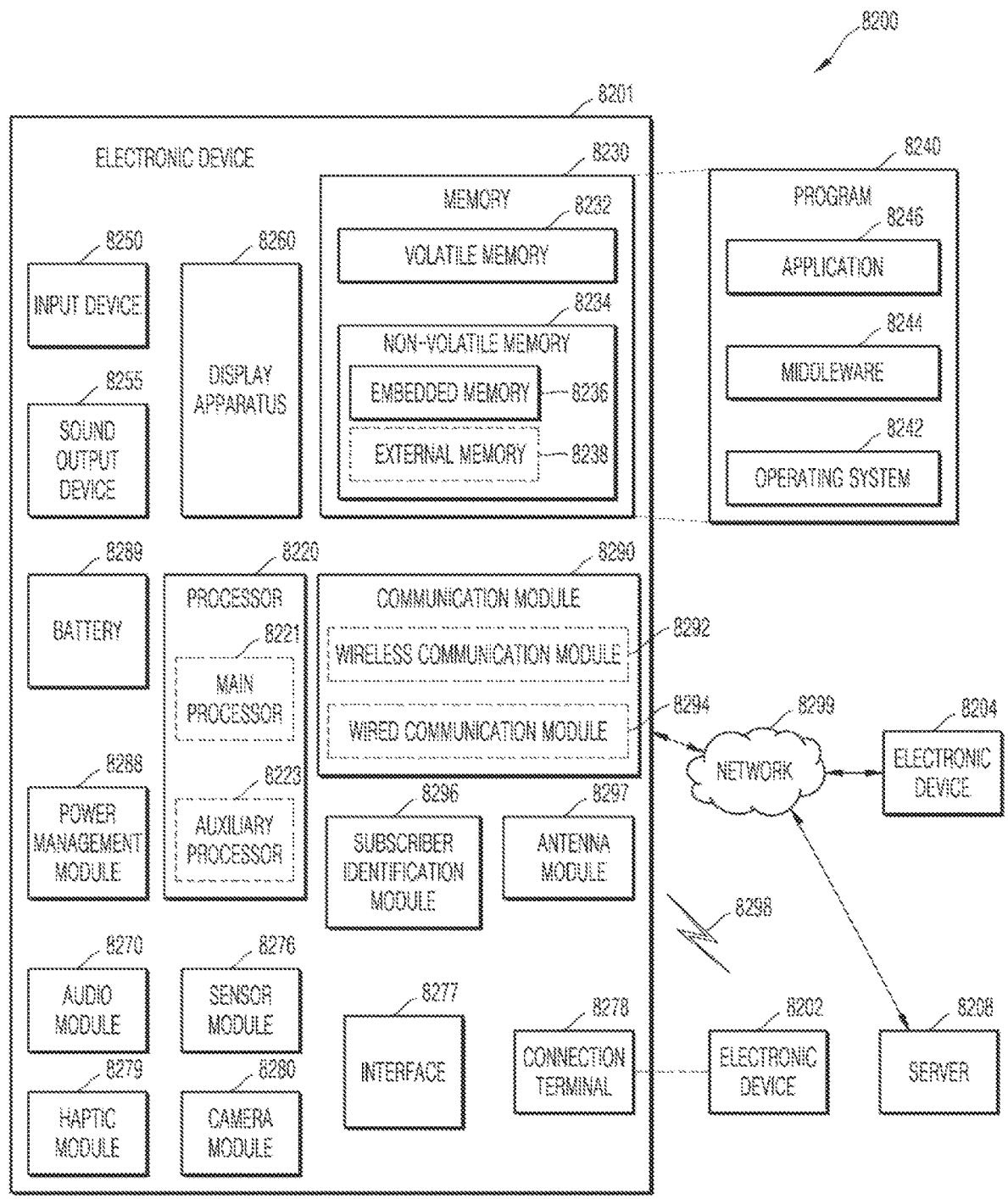
FIG. 42 is a schematic block diagram of an electronic device according to an example embodiment.

FIG. 42 is a block diagram of an electronic device 8201 including a display apparatus 8260 according to an example embodiment.

Referring to FIG. 42, the electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a remote wireless communication network, etc.). The electronic device 8201 may communicate with the electronic device 8204 through the server 8208. The electronic device 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. The electronic device 8201 may omit one or more of the components or may further include other components. One or more of the components may be realized as an integrated circuit. For example, the sensor module 8276 (a fingerprint sensor, an iris sensor, an illumination sensor, etc.) may be embedded in the display apparatus 8269 (a display, etc.).

The processor 8220 may be configured to execute software (a program 8240, etc.) to control one or more components (hardware or software components) of the electronic device 8201, the components being connected to the processor 8220, and to perform various data processing or calculations. As part of the data processing or calculations, the processor 8220 may be configured to load a command and/or data received from other components (the sensor module 8276, the communication module 8290, etc.) into the volatile memory 8232, process the command and/or the data stored in a volatile memory 8232, and store resultant data in a nonvolatile memory 8234. The processor 8220 may include a main processor 8221 (a central processing unit (CPU), an application processor (AP), etc.) and an auxiliary processor 8223 (a graphics processing unit (GPU), an image signal processor, a sensor hub processor, a communication processor, etc.) which may independently operate or operate with the main processor 8221. The auxiliary processor 8223 may use less power than the main processor 8221 and may perform specialized functions.

When the main processor 8221 is in an inactive state (a sleep state), the auxiliary processor 8223 may take charge of an operation of controlling functions and/or states related to one or more components (the display apparatus 8260, the sensor module 8276, the communication module 8290, etc.) from among the components of the electronic device 8201, or when the main processor 8221 is in an active state (an application execution state), the auxiliary processor 8223 may perform the same operation along with the main processor 8221. The auxiliary processor 8223 (the image signal processor, the communication processor, etc.) may be realized as part of other functionally-related components (the camera module 8280, the communication module 8290, etc.).

The memory 2230 may store various data required by the components (the processor 8220, the sensor module 8276, etc.) of the electronic device 8201. The data may include, for example, software (the program 8240, etc.), input data and/or output data of a command related to the software. The memory 8230 may include the volatile memory 8232 and/or the nonvolatile memory 8234.

The program 8240 may be stored in the memory 8230 as software, and may include an operating system 8242, middleware 8244, and/or an application 8246.

The input device 8250 may receive a command and/or data to be used by the components (the processor 8220, etc.) of the electronic device 8201 from the outside of the electronic device 8201. The input device 8250 may include a remote controller, a microphone, a mouse, a keyboard, and/or a digital pen (a stylus pen, etc.).

The sound output device 8255 may output a sound signal to the outside of the electronic device 8201. The sound output device 8255 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus 8260 may visually provide information to the outside of the electronic device 8201. The display apparatus 8260 may include a display, a hologram device, or a controlling circuit for controlling a projector and a corresponding device. The display apparatus 8260 may be manufactured according to the manufacturing method described with reference to FIGS. 1 through 28 and may include the display transfer structures described with reference to FIGS. 29 through 41. The display apparatus 8260 may include touch circuitry configured to sense a touch operation and/or sensor circuitry (a pressure sensor, etc.) configured to measure an intensity of a force generated by the touch operation.

The audio module 8270 may convert sound into an electrical signal or an electrical signal into sound. The audio module 8270 may obtain sound via the input device 8250 or may output sound via the sound output device 8255 and/or a speaker and/or a headphone of an electronic device (the electronic device 8202, etc.) directly or wirelessly connected to the electronic device 8201.

The sensor module 8276 may sense an operation state (power, temperature, etc.) of the electronic device 8201 or an external environmental state (a user state, etc.) and generate electrical signals and/or data values corresponding to the sensed state. The sensor module 8276 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols to be used for the electronic device 8201 to be directly or wirelessly connected to another electronic device (the electronic device 8202, etc.). The interface 8277 may include a high-definition multimedia interface (HDMI) interface, a universal serial bus (USB) interface, an SD card interface, and/or an audio interface.

A connection terminal 8278 may include a connector, through which the electronic device 8201 may be physically connected to another electronic device (the electronic device 8202, etc.). The connection terminal 8278 may include an HDMI connector, a USB connector, an SD card connector, and/or an audio connector (a headphone connector, etc.).

A haptic module 8279 may convert an electrical signal into a mechanical stimulus (vibration, motion, etc.) or an electrical stimulus which is recognizable to a user via haptic or motion sensation. The haptic module 8279 may include a motor, a piezoelectric device, and/or an electrical stimulus device.

The camera module 8280 may capture a still image and a video. The camera module 8280 may include a lens assembly including one or more lenses, image sensors, image signal processors, and/or flashes. The lens assemblies included in the camera module 8280 may collect light emitted from an object, an image of which is to be captured.

The power management module 8288 may manage power supplied to the electronic device 8201. The power management module 8388 may be realized as part of a power management integrated circuit (PMIC).

The battery 8289 may supply power to the components of the electronic device 8201. The battery 8289 may include a non-rechargeable primary battery, rechargeable secondary battery, and/or a fuel battery.

The communication module 8290 may support establishment of direct (wired) communication channels and/or wireless communication channels between the electronic device 8201 and other electronic devices (the electronic device 8202, the electronic device 8204, the server 8208, etc.) and communication performance through the established communication channels. The communication module 8290 may include one or more communication processors separately operating from the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, and/or a wired communication module 8294 (a local area network (LAN) communication module, a power line communication module, etc.). From these communication modules, a corresponding communication module may communicate with other electronic devices through a first network 8298 (a short-range wireless communication network, such as Bluetooth, Wifi direct, or infrared data association (IrDa)) or a second network 8299 (a remote communication network, such as a cellular network, the Internet, or a computer network (LAN, WAN, etc.)). Various types of communication modules described above may be integrated as a single component (a single chip, etc.) or realized as a plurality of components (a plurality of chips). The wireless communication module 8292 may identify and authenticate the electronic device 8201 within the first network 8298 and/or the second network 8299 by using subscriber information (international mobile subscriber identification (IMSI), etc.) stored in the subscriber identification module 8296.

The antenna module 8297 may transmit a signal and/or power to the outside (other electronic devices, etc.) or receive the same from the outside. The antenna may include an emitter including a conductive pattern formed on a substrate (a printed circuit board (PCB), etc.). The antenna module 8297 may include an antenna or a plurality of antennas. When the antenna module 8297 includes a plurality of antennas, an appropriate antenna which is suitable for a communication method used in the communication networks, such as the first network 8298 and/or the second network 8299, may be selected. Through the selected antenna, signals and/or power may be transmitted or received between the communication module 8290 and other electronic devices. In addition to the antenna, another component (a radio frequency integrated circuit (RFIC), etc.) may be included in the antenna module 8297.

One or more of the components of the electronic device 8201 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.).

The command or the data may be transmitted or received between the electronic device 8201 and another external electronic device 8204 through the server 8108 connected to the second network 8299. Other electronic devices 8202 and 8204 may be electronic devices that are homogeneous or heterogeneous types with respect to the electronic device 8201. All or part of operations performed in the electronic device 8201 may be performed by one or more of the other electronic devices 8202, 8204, and 8208. For example, when the electronic device 8201 has to perform a function or a service, instead of directly performing the function or the service, the one or more other electronic devices may be requested to perform part or all of the function or the service. The one or more other electronic devices receiving the request may perform an additional function or service related to the request and may transmit a result of the execution to the electronic device 8201. To this end, cloud computing, distribution computing, and/or client-server computing techniques may be used.

Figure 43:
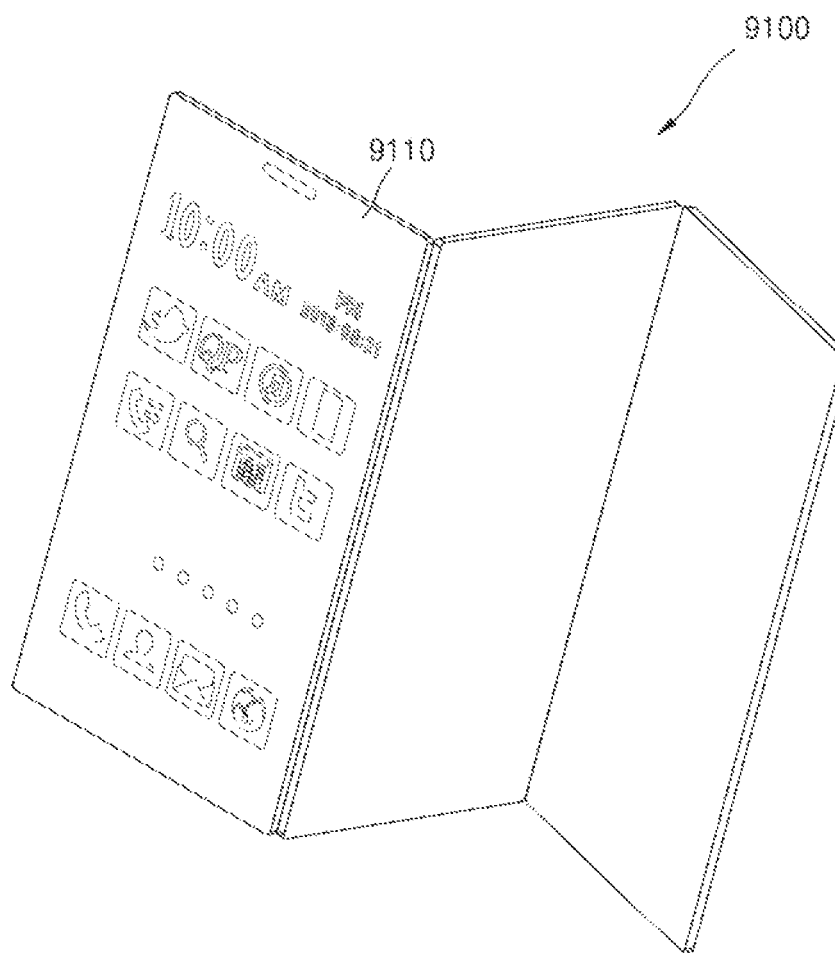
FIG. 43 illustrates an example in which a display apparatus according to an example embodiment is applied to a mobile device.

FIG. 43 illustrates an example in which an electronic device according to an example embodiment is applied to a mobile device 9100. The mobile device 9100 may include the display apparatus 9110, and the display apparatus 9110 may include the display transfer structures described with reference to FIGS. 29 through 42. The display apparatus 9110 may have a foldable structure, for example, a multi-foldable structure.

Figure 44:
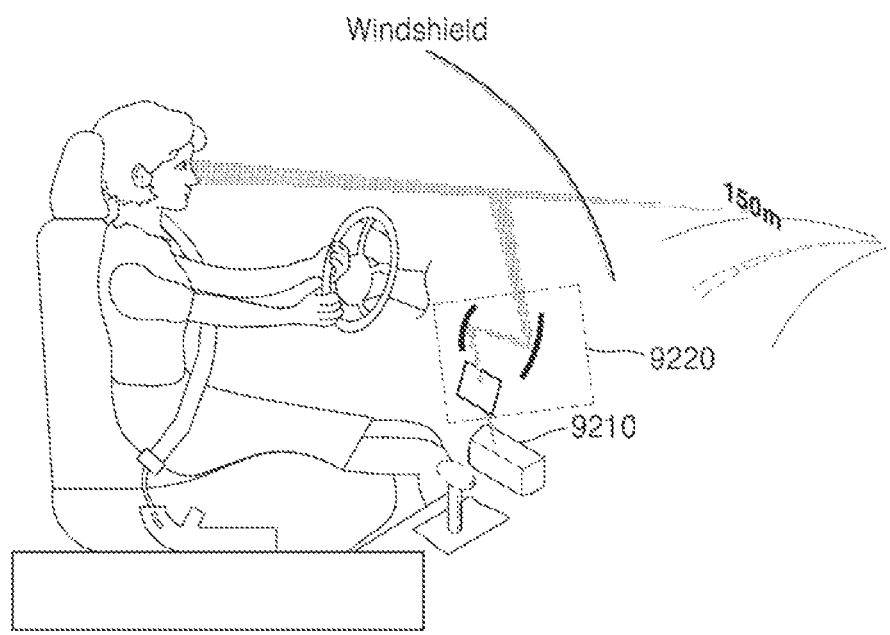
FIG. 44 illustrates an example in which a display apparatus according to an example embodiment is applied to a vehicle display apparatus.

FIG. 44 illustrates an example in which a display apparatus according to an example embodiment is applied to a vehicle. The display apparatus may correspond to a vehicle head up display apparatus 9200 and may include a display 9210 provided in a region of the vehicle and an optical path-change member 9220 configured to convert an optical path for a driver to watch an image generated by the display 9210.

Figure 45:
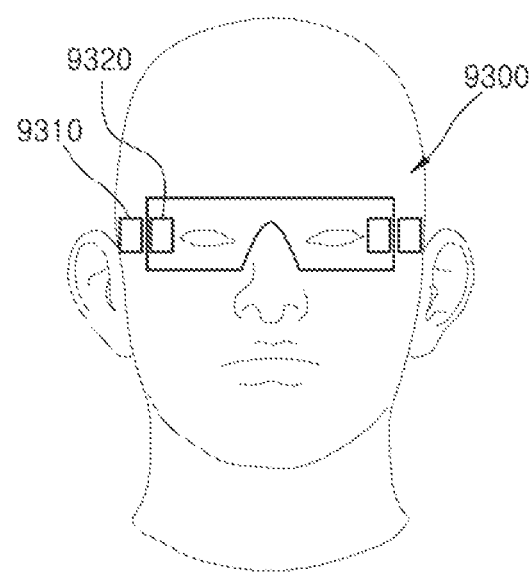
FIG. 45 illustrates an example in which a display apparatus according to an example embodiment is applied to augmented reality (AR) glasses.

FIG. 45 illustrates an example in which a display apparatus according to an example embodiment is applied to augmented reality (AR) glasses 9300 or virtual reality (VR) glasses. The AR glasses 9300 may include a projection system 9310 configured to form an image and a component 9320 configured to guide an image from the projection system 9310 to the eye of a user. The projection system 9310 may include the display transfer structures described with reference to FIGS. 29 through 42.

Figure 46:
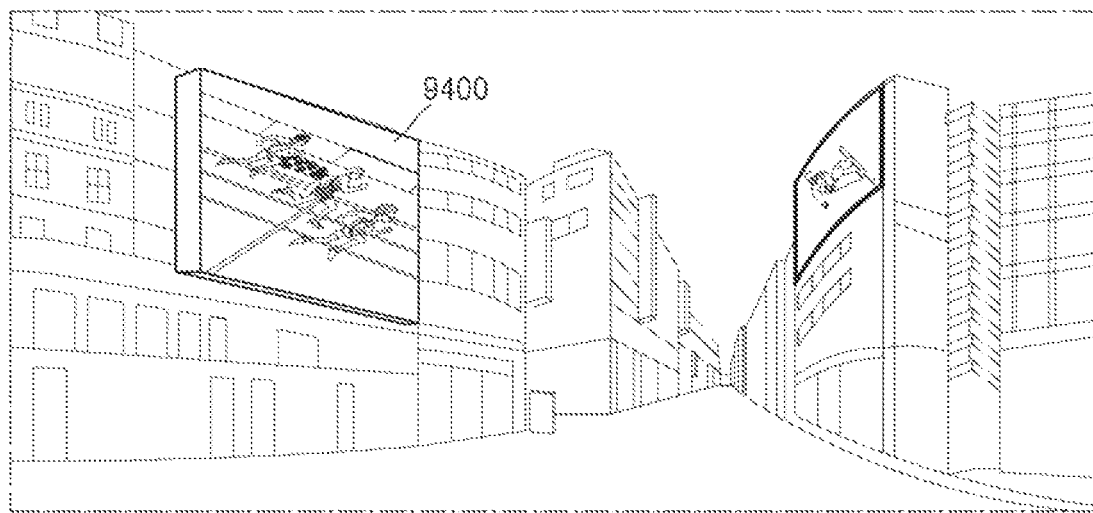
FIG. 46 illustrates an example in which a display apparatus according to an example embodiment is applied to a signage.

FIG. 46 illustrates an example in which a display apparatus according to an example embodiment is applied to a large signage 9400. The signage 9400 may be used for outdoor advertising using digital information display and may control advertisement content through a communication network. The signage 9400 may be realized for example by the electronic device described with reference to FIG. 42.

Figure 47:
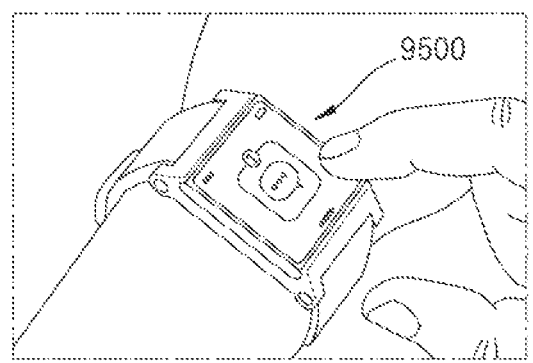
FIG. 47 illustrates an example in which a display apparatus according to an example embodiment is applied to a wearable display.

FIG. 47 illustrates an example in which a display apparatus according to an example embodiment is applied to a wearable display 9500. The wearable display 9500 may include the display transfer structures described with reference to FIGS. 29 through 41 or may be realized by the electronic device 8201 described with reference to FIG. 42.

Also, the display apparatus according to an embodiment may be applied to various devices, such as a rollable TV, a stretchable display, etc.

The embodiments described above are only examples. One of ordinary skill in the art may understand that various modifications and equivalent embodiments are possible based on described embodiments. Thus, the true technical protection range according to the embodiments shall be defined by the technical concept of the disclosure stated in the claims below.

According to the alignment method according to an example embodiment, the micro-semiconductor chips may be efficiently aligned in a large area based on a wet alignment method. According to the display transfer structures according to example embodiments, the micro-semiconductor chips may be aligned in a large area, so as to be easily implemented in large display apparatuses.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A wet alignment method for a micro-semiconductor chip, the wet alignment method comprising:
   supplying a liquid to a plurality of grooves in a transfer substrate;
   supplying a plurality of micro-semiconductor chips onto the transfer substrate; and
   aligning the plurality of micro-semiconductor chips with the plurality of grooves by moving a liquid absorber over the plurality of grooves to contact directly with the transfer substrate,
   wherein the supplying of the liquid, the supplying of the plurality of micro-semiconductor chips, and the aligning comprise:
   soaking the liquid absorber in a suspension comprising the liquid and the plurality of micro-semiconductor chips to affix the plurality of micro-semiconductor chips onto the liquid absorber; and
   scanning the transfer substrate by moving the liquid absorber along the plurality of grooves on the transfer substrate, to release the plurality of micro-semiconductor chips from the liquid absorber onto the transfer substrate and to draw the liquid from the plurality of grooves to the liquid absorber.

2. The wet alignment method of claim 1, wherein the supplying of the liquid comprises at least one of spraying, dispensing, inkjet dot spreading, and spilling the liquid onto the transfer substrate.

3. The wet alignment method of claim 1, wherein the supplying of the liquid is simultaneously performed with the supplying of the plurality of micro-semiconductor chips by boding the plurality of micro-semiconductor chips to the liquid absorber, and moving the liquid absorber on the transfer substrate.

4. The wet alignment method of claim 1, wherein the supplying of the liquid and the supplying of the plurality of micro-semiconductor chips are performed as a single process of supplying a suspension comprising the liquid and the plurality of micro-semiconductor chips to the transfer substrate.

5. The wet alignment method of claim 4, wherein the supplying of the suspension to the transfer substrate comprises at least one of spraying, dispensing, inkjet dot spreading, and spilling the suspension to the transfer substrate.

6. The wet alignment method of claim 1, wherein the supplying of the plurality of micro-semiconductor chips comprises:
   attaching the plurality of micro-semiconductor chips to the liquid absorber; and
   disposing the liquid absorber to which the plurality of micro-semiconductor chips are attached, to contact the transfer substrate.

7. The wet alignment method of claim 1, wherein the supplying of the plurality of micro-semiconductor chips comprise:
   preparing a suspension by including the plurality of micro-semiconductor chips in another liquid; and
   providing the suspension to the transfer substrate.

8. The wet alignment method of claim 1, wherein at least one of the supplying of the liquid, the supplying of the plurality of micro-semiconductor chips, and the aligning the plurality of micro-semiconductor chips is repeated a plurality of times.

9. The wet alignment method of claim 1, wherein the aligning the plurality of micro-semiconductor chips comprises allowing the liquid absorber to contact the transfer substrate and pass across the plurality of grooves.

10. The wet alignment method of claim 1, wherein the aligning the plurality of micro-semiconductor chips comprises at least one of a reciprocating motion, a translation motion, a rotational motion, a rolling motion, a rubbing motion, and a spinning motion of the liquid absorber, or comprises at least one of a reciprocating motion, a translation motion, a rotational motion, a rolling motion, a rubbing motion, and a spinning motion of the transfer substrate.

11. The wet alignment method of claim 1, wherein the liquid comprises any one or any combination of water, ethanol, alcohol, polyol, ketone, halocarbon, acetone, a flux, and an organic solvent.

12. The wet alignment method of claim 1, wherein the liquid absorber comprises fabric, a tissue, a polyester fiber, paper, or a wiper.

13. The wet alignment method of claim 1, wherein a first micro-semiconductor chip of the plurality of micro-semiconductor chips comprises an electrode disposed on a surface of the first micro-semiconductor chip, and
   when the first micro-semiconductor chip enters a first groove of the plurality of grooves, the electrode of the first micro-semiconductor chip is disposed to face an upper opening of the first groove via the scanning of the transfer substrate by using the liquid absorber.

14. The wet alignment method of claim 13, wherein the electrode comprises at least one of Al, Au, Pt, Mo, Cu, Ag, and Zn.

15. The wet alignment method of claim 1, wherein the transfer substrate comprises a metal layer disposed on an upper surface of the plurality of grooves.

16. The wet alignment method of claim 15, wherein the metal layer comprises at least one of Ag, Au, Pt, Ni, Cr, and Al.

17. A display transfer structure comprising:
   a transfer substrate comprising a plurality of grooves; and
   a plurality of micro-semiconductor chips that are disposed in the plurality of grooves, wherein
   each of the plurality of micro-semiconductor chips comprises a first electrode and a second electrode that are disposed on a top surface of each of the plurality of micro-semiconductor chips to face an upper opening of a corresponding groove of the plurality of grooves that is opposite to a bottom surface of the corresponding groove, the display transfer structure further comprises:
an insulating layer provided on an upper surface of the plurality of micro-semiconductor chips except for electrode connection portions; and
driving circuits provided on the insulating layer and connected to the first electrode and the second electrode.

18. The display transfer structure of claim 17, wherein the transfer substrate comprises a metal layer disposed on an upper surface of the plurality of grooves.

19. The display transfer structure of claim 18, wherein the metal layer comprises at least one of Ag, Au, Pt, Ni, Cr, and Al.

20. The display transfer structure of claim 17, wherein the plurality of micro-semiconductor chips are irregularly aligned with the plurality of grooves.

21. The display transfer structure of claim 17, wherein at least one of the plurality of micro-semiconductor chips comprises a horizontal electrode structure.

22. The display transfer structure of claim 17, wherein the transfer substrate comprises a region that corresponds to a sub-pixel, and the region comprises the plurality of grooves.

23. The display transfer structure of claim 17, wherein each of the plurality of grooves has a size to accommodate two or more of the plurality of micro-semiconductor chips.

24. The display transfer structure of claim 17, further comprising a color conversion layer disposed on the plurality of micro-semiconductor chips and configured to convert a color of light emitted from the plurality of micro-semiconductor chips.

* * * * *